United States Patent
Qin et al.

(10) Patent No.: US 10,059,796 B2
(45) Date of Patent: Aug. 28, 2018

(54) CONJUGATED POLYMERS

(71) Applicant: Commonwealth Scientific and Industrial Research Organisation, Australian Capital Territory (AU)

(72) Inventors: Tianshi Qin, Ormonde (AU); Scott Edward Watkins, Williamstown (AU)

(73) Assignee: COMMONWEALTH SCIENTIFIC AND INDUSTRIAL RESEARCH ORGANISATION, Campbell (AU)

(*) Notice: Subject to any disclaimer, the term of this patent is extended or adjusted under 35 U.S.C. 154(b) by 390 days.

(21) Appl. No.: 14/909,036

(22) PCT Filed: Jul. 28, 2014

(86) PCT No.: PCT/AU2014/000761
§ 371 (c)(1),
(2) Date: Jan. 29, 2016

(87) PCT Pub. No.: WO2015/013747
PCT Pub. Date: Feb. 5, 2015

(65) Prior Publication Data
US 2016/0194439 A1  Jul. 7, 2016

(30) Foreign Application Priority Data
Jul. 30, 2013  (AU) .................. 2013902829

(51) Int. Cl.
*C08G 61/12* (2006.01)
*H01L 51/00* (2006.01)
*H01L 51/42* (2006.01)

(52) U.S. Cl.
CPC ........ *C08G 61/126* (2013.01); *H01L 51/0036* (2013.01); *H01L 51/0043* (2013.01);
(Continued)

(58) Field of Classification Search
CPC .............. C08G 61/126; C08G 2261/12; C08G 2261/91; C08G 2261/149;
(Continued)

(56) References Cited

U.S. PATENT DOCUMENTS

2012/0205593 A1* 8/2012 Ohya ................. B82Y 10/00
252/500

FOREIGN PATENT DOCUMENTS

WO   WO 2010/016986 A1 *  2/2010
WO   WO 2012/054910 A1 *  4/2012
WO   WO 2013/010209 A1 *  1/2013

OTHER PUBLICATIONS

Tianshi Qin, Wojciech Zajaczkowski, Wojciech Pisula, Martin Baumgarten, Ming Chen, Mei Gao, Gerry Wilson, Christopher D. Easton, and Scott E. Watkins, Tailored Donor—Acceptor Polymers with an A—D1—A—D2 Structure: Controlling Intermolecular Interactions to Enable Enhanced Polymer Photovoltaic Devices, J. Am. Chem. Soc. 2014, 136, 6049-6055.*

(Continued)

*Primary Examiner* — Bijan Ahvazi
(74) *Attorney, Agent, or Firm* — John P. White; Cooper & Dunham LLP

(57) ABSTRACT

The present invention comprises a conjugated polymer for optoelectronic devices, comprising a structural unit of formula (I) or formula (II):

-[A-D1-A-D2]n-  (I)

-[A1-D1-A2-D2]n-  (II)

wherein A is an acceptor group; A1 and A2 are acceptor groups which differ from one another; D1 and D2 are donor groups which differ from one another; and n is an integer between 30 and 1000.

19 Claims, 6 Drawing Sheets

(52) U.S. Cl.
CPC ........ *H01L 51/0047* (2013.01); *C08G 61/123* (2013.01); *C08G 2261/12* (2013.01); *C08G 2261/146* (2013.01); *C08G 2261/149* (2013.01); *C08G 2261/3243* (2013.01); *C08G 2261/3246* (2013.01); *C08G 2261/3247* (2013.01); *C08G 2261/91* (2013.01); *H01L 51/4253* (2013.01); *Y02E 10/549* (2013.01)

(58) Field of Classification Search
CPC .... C08G 2261/3243; C08G 2261/3246; C08G 2261/3247; H01L 51/0036; H01L 51/0043; H01L 51/0047; H01L 51/4253
See application file for complete search history.

(56) References Cited

OTHER PUBLICATIONS

Ji-Hoon Kim, Hee Un Kim, Chang Eun Song, In-Nam Kang, Jin-Kyun Lee, Won Suk Shin, Do-Hoon Hwang, Benzotriazole-baseddonor—acceptortypesemiconductingpolymers with differentalkylsidechainsforphotovoltaicdevices, Solar Energy Materials & SolarCells 108 (2013)113-125.*

Prakash Sista, Ruvini S. Kularatne, Michael E. Mulholland, Mitchell Wilson, Natalie Holmes, Xiaojing Zhou, Mihaela C. Stefan, Synthesis and Photovoltaic Performance of Donor—Acceptor Polymers Containing Benzo[1,2-b:4,5-b']dithiophene with Thienyl Substituents, Journal of Polymer Science, Part A: Polymer Chemistry 2013, 51, 2622-2630.*

\* cited by examiner

CONJUGATED POLYMERS

CROSS-REFERENCE TO RELATED APPLICATIONS

This application is a § 371 national stage of PCT International Application No. PCT/AU2014/000,761, filed Jul. 28, 2014, claiming priority of Australian Patent Application No. 2013902829, filed Jul. 30, 2013, the content of each of which is hereby incorporated by reference into the application.

FIELD

Novel conjugated polymers are disclosed. The polymers find particular use in optoelectronic devices.

BACKGROUND

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Photovoltaic (PV) devices or solar cells, which are a type of photosensitive optoelectronic device, are specifically used to generate electrical power. PV devices, which may generate electrical power from light sources other than sunlight, are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

Organic bulk heterojunction photovoltaic cells employ a blended combination of a p-type donor material and an n-type acceptor material (most commonly a fullerene derivative such as $PC_{61}BM$ or $PC_{71}BM$ or the analogous bis-indene adducts of $C_{60}$ or $C_{70}$ respectively). Charge separation is facilitated by migration of an exciton (formed by photoexcitation) to the heterojunction. Charge separation is promoted by the offset in levels of the HOMO of the p-type material and the LUMO of the electron acceptor. For donor materials blended with fullerene derivatives, the HOMO-LUMO gap should be in the range of 1.5 to 1.8 eV and the HOMO energy level should be low (−5.2 to −5.8 eV). The LUMO energy level of the donor should be 0.2 eV above the LUMO level of the acceptor to promote negative charge migration to the acceptor after photoexcitation. These concepts have been fully described in the publications by C. J. Brabec et al., *Adv. Mater.*, 2010, 22, 3839; G. Dennler, M. C. Scharber and C. J. Brabec, *Adv. Mater.* 2009, 21, 1323 (for donor polymers) and A. Mishra and P. Baeuerle, *Angew. Chem. Int. Ed.*, 2012, 51, 2020 (for small molecules).

Bulk heterojunction solar cell energy conversion efficiencies in a single junction device have now been reported to reach ca.10% efficiency under standard AM1.5 conditions with 1 sun irradiation (100 mW $cm^{-2}$). Efficiencies are determined by open circuit voltage $V_{oc}$ (ideally reaching up to or >1 V), short circuit current $J_{sc}$ (ideally in excess of 13 mA $cm^{-2}$) and fill factor FF (ideally in excess of 65%). Features that are known to contribute to improving these factors include (i) offset of the energy of the HOMO of the donor and the LUMO of the acceptor (allowing for a 0.3 eV energy difference to promote charge separation at the heterojunction); (ii) low HOMO-LUMO energy gap of the donor material to maximise photon absorption in the 800 nm region corresponding to the wavelength of maximum photon solar emission; (iii) ideal exciton diffusion length of about 10 nm which is largely determined by feature sizes and the morphology of the blend of donor and acceptor materials; (iv) balanced charge mobilities in the donor and acceptor materials; (v) high number average molar mass (for polymers) of the donor materials.

Recently it has become apparent that the combination of donor and acceptor type building blocks in well-defined polymers can lead to donor p-type materials having the preferred low HOMO-LUMO gap corresponding to a long wavelength absorption maximum ideal for solar energy. A useful donor building block is based on the benzodithiophene unit carrying "orthogonal" (for molecular stacking) thiophene substituents with long chain alkyl substituents (L. Huo, S. Zhang, X. Guo, F. Xu, Y. Li, J. Hou, *Angew. Chem. Int. Ed.*, 2011, 50, 9697).

While polymeric materials comprising the combination of donor and acceptor type building blocks have been described, there remains the problem of providing donor and acceptor type building blocks having improved performance in photovoltaic devices.

Furthermore, while advances in polymeric materials continue to be made there remains a need to provide new polymers useful in the preparation of optoelectronic devices.

SUMMARY

In a first aspect there is provided a conjugated polymer comprising a structural unit (I) wherein donor moieties D1 and D2 are different, and wherein acceptor moieties A are the same, or a conjugated polymer comprises a structural unit (II) wherein donor moieties D1 and D2 are different, and wherein acceptor moieties A1 and A2 are different, and wherein in both cases, preferably 30<n<1000.

 (I)

 (II)

As used herein the term 'different' preferably means that the donor moieties D1 and D2 or acceptor moieties A1 and A2 comprise different conjugated ring systems or comprise different substituents on the same conjugated ring system or comprise both different conjugated rings systems and different substituents.

As used herein the terms 'donor' and 'acceptor' preferably mean that when comparing two moieties, the moiety with the energetically lowest HOMO, as measured by the lowest ionisation potential, is the donor. To be clear, by lowest it is meant closest to vacuum, that is, for example −5 eV is lower than −6 eV. In some embodiments according to the first aspect the donor moieties D1 and D2 are independently selected from structures (III) to (IXb).

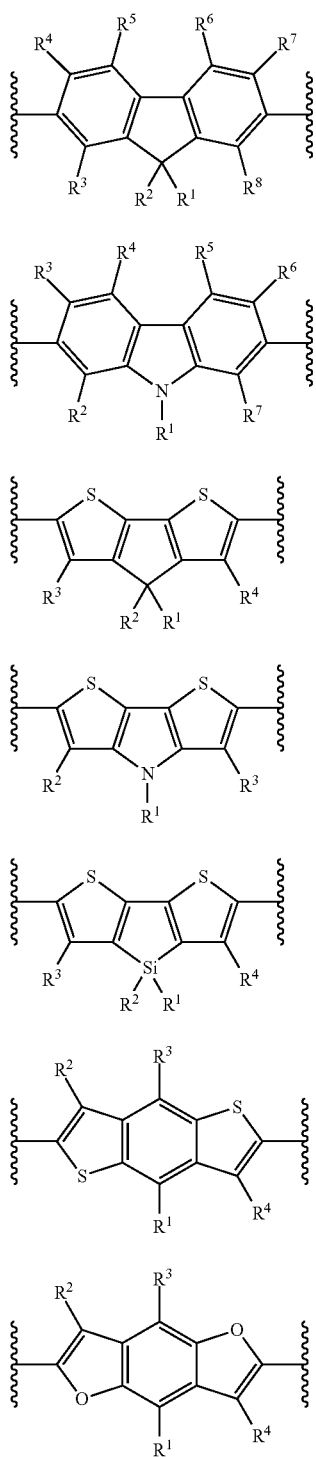

(III)
(IV)
(V)
(VI)
(VII)
(VIII)
(IX)
(IXa)
(IXb)

wherein $R^1$ to $R^8$ are independently selected from hydrogen, optionally substituted alkyl, optionally substituted alkenyl, optionally substituted alkynyl, optionally substituted carbocyclyl, optionally substituted aryl, and optionally substituted heterocyclyl.

In some embodiments according to the first aspect the donor moieties D1 and D2 are independently selected from structure (X)

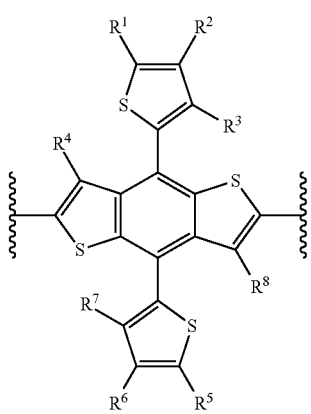

(X)

wherein $R^1$ to $R^8$ are independently selected from hydrogen, optionally substituted alkyl, optionally substituted alkenyl, optionally substituted alkynyl, optionally substituted carbocyclyl, optionally substituted aryl, and optionally substituted heterocyclyl.

In some embodiments according to the first aspect the acceptor moieties A, A1 and A2 are independently selected from one or more of the following formulae 3 to 23;

3

4

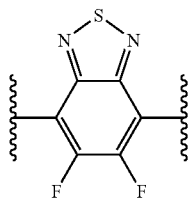
5
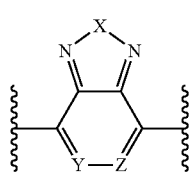
6
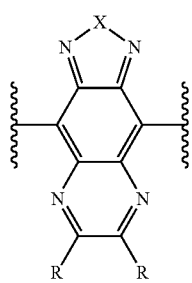
7
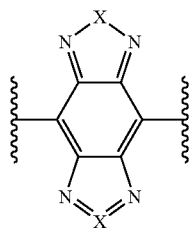
8
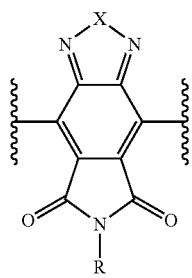
9
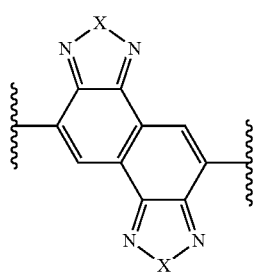
10
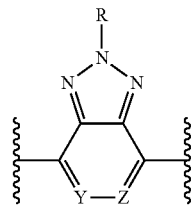
11
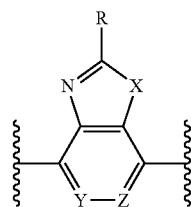
12
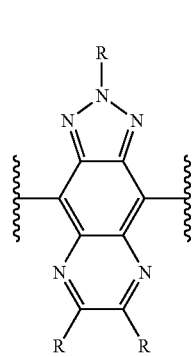
13
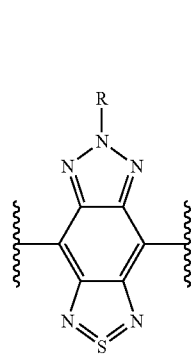
14
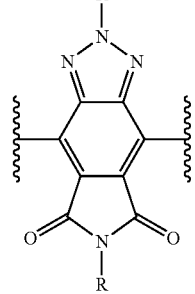
15

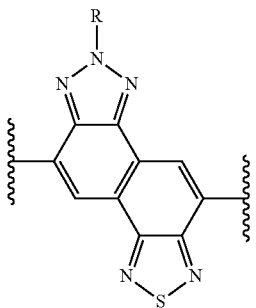

16

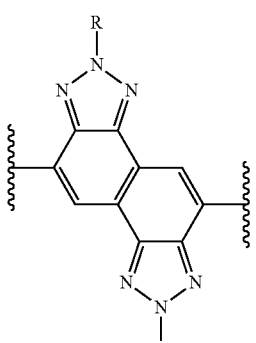

17

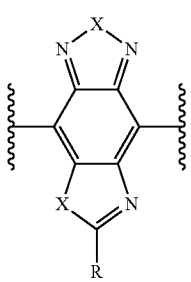

18

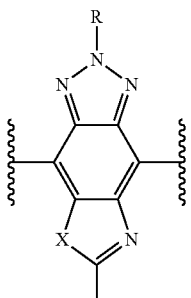

19

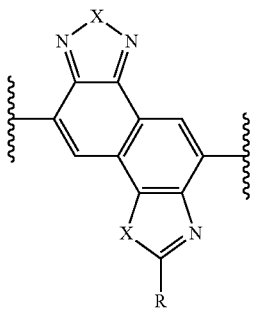

20

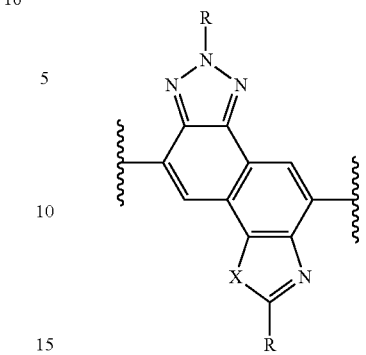

21

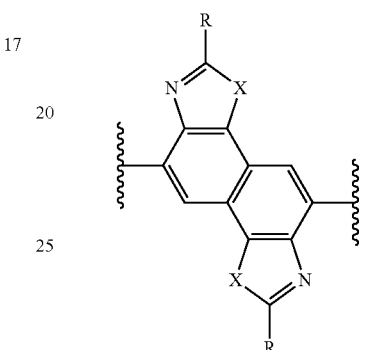

22

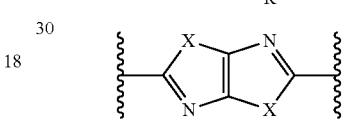

23

X = S or O

Y = CH, CR, CF, C—CF₃, C—CN, C—Cl, N, C—COOH, C—COOR, C—CONHR

Z = CH, CR, CF, C—CF₃, C—CN, C—Cl, N, C—COOH, C—COOR, C—CONHR

R = alkyl, aryl wherein X is O or S, Y and Z are independently selected from the group consisting of CH, CR, CF, C—CF₃, C—CN, C—F, C—Cl, C—Br, N, C—COOH, C—COOR or C—CONHR and each occurrence of R is independently selected from hydrogen, optionally substituted alkyl, optionally substituted alkenyl, optionally substituted alkynyl, optionally substituted carbocyclyl, optionally substituted aryl, and optionally substituted heterocyclyl.

Alternatively or additionally, $R^1$ to $R^8$ in structures (III) to (X) may be independently selected from alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, al koxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheterorayl, nitrocarbocyclyl, nitroacyl, nitroaralkyl, amino ($NH_2$), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate and phosphate groups.

Alternatively or additionally, each occurrence of R in structures 3 to 23 may be independently selected from alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, alkoxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheteroayl, nitrocarbocyclyl, nitroacyl, nitroaralkyl, amino ($NH_2$), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate and phosphate groups.

Alternatively or additionally, in structures 3 to 23 one or more unsubstituted ring atoms, when present, may be optionally substituted with optionally substituted alkyl, optionally substituted alkenyl, optionally substituted alkynyl, optionally substituted carbocyclyl, optionally substituted aryl, and optionally substituted heterocyclyl. Alternatively or additionally, the one or more unsubstituted ring atoms in structures 3 to 23, when present, may be independently selected from alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, alkoxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheteroayl, nitrocarbocyclyl, nitroacyl, nitroaralkyl, amino ($NH_2$), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate and phosphate groups.

The optional substituents present on structures (III) to (X) and 3 to 23 are preferably independently selected from alkyl, amino, alkylamino, thio, alkylthio, halo, alkylhalo and alkoxy.

In some embodiments the difference between donor moieties D1 and D2 or acceptor moieties A1 and A2 is reflected by different substituents on the donor or acceptor sub-structure. By sub-structure it is meant the conjugated ring system present in the donor or acceptor moiety.

Structure (X) is a preferred donor component. In some embodiments one or more of the substituents, $R^3$, $R^4$, $R^7$ and $R^8$, of structure (X) are hydrogen.

In some embodiments, in structure (X), the substituents $R^1$, $R^2$, $R^5$ and $R^6$ may be independently selected from hydrogen or optionally substituted alkyl. Structure (X) may have, in one exemplary embodiment, $R^1$, $R^2$, $R^5$ and $R^6$ independently selected from hydrogen or an optionally substituted alkyl where the number of carbons in the alkyl chain is equal to or greater than 6. In one preferred embodiment $R^2$ and $R^6$ are n-hexyl and $R^1$ and $R^5$ are 2-ethyhexyl in D1 and $R^2$ and $R^6$ are n-hexyl and $R^1$ and $R^5$ are hydrogen in D2.

In some embodiments the acceptor moieties may be selected from one or more of structures 3, 4 or 5. Particularly preferred acceptor moieties are structures 3, 4 and 5.

In some embodiments the nature of the substituents on one or more of D1 or D2, may be varied to improve solution processibility, that is, increase solubility, while the substituents on one or more of A, A1 and A2 may be modified to alter the HOMO-LUMO energy gap, solution processibility, for example to increase solubility, and to improve device efficiencies in bulk heterojunction solar cell efficiencies in blends formed with fullerenes and other acceptor molecules.

Furthermore it is possible to provide polymers which comprise different donor moieties having different solubilising domains. In one embodiment, one donor moiety, for example D1, may have longer alkyl chain substituents that D2.

Advantageously, in regard, for example, to A-D1-A-D2 type polymers, highly ordered materials may be prepared by controlling the relative size of the substituents on D1 and D2.

In some embodiments the polymers have molar mass in the range of 10,000<Mn<200,000 Daltons, preferably 20,000<Mn<175,000 Daltons, more preferably 30,000<Mn<150,000 Daltons. Particularly useful molecular weights are in the range 40,000<Mn<100,000 Daltons.

It is understood that the hereinbefore disclosed polymers contain endcapping organic or inorganic groups. In some embodiments the polymers contain thiophene or phenyl endcapping groups.

In some embodiments one or more of the donor and acceptor moieties comprises polymerisable/cross linkable groups. Polymerisation or cross linking may be induced by heat, chemical means or light.

In a second aspect there is provided a macromonomer comprising a structural unit (XI) said structural unit comprising donor and acceptor moieties

A-D1-A       (XI).

In some embodiments the donor moiety may be selected from structures (III) to (X) and the acceptor moieties selected from structures 3 to 23 as hereinbefore described.

In a third aspect there is provided a macromonomer comprising a structural unit (XII) said structural unit comprising donor and acceptor moieties

A1-D1-A2       (XII).

In some embodiments the donor moiety may be selected from structures (III) to (X) and the acceptor moieties selected from structures 3 to 23 as hereinbefore described.

In a fourth aspect there is provided a method of preparing a conjugated polymer comprising a structural unit (I)

-[A-D1-A-D2]$_n$-       (I)

said structural unit comprising different donor moieties D1 and D2 and acceptor moieties A and wherein 30<n<1000, by reacting a macromonomer comprising a structural unit A-D1-A with a donor D2.

In some embodiments the donor moieties may be selected from structures (III) to (X) and the acceptor moieties selected from structures 3 to 23 as hereinbefore described.

In a fifth aspect there is provided a method of preparing a conjugated polymer comprising a structural unit (II)

-[A1-D1-A2-D2]$_n$-       (II)

said structural unit comprising different donor moieties D1 and D2 and different acceptor moieties A1 and A2, wherein 30<n<1000, by reacting a macromonomer comprising a structural unit A1-D1-A2 with a donor D2.

In some embodiments the donor moieties may be selected from structures (III) to (X) and the acceptor moieties selected from structures 3 to 23 as hereinbefore described.

The present inventors have found that a conjugated polymer having the formula (I) results in improved performance when incorporated in photovoltaic devices. It was found that regioregular conjugated polymers having the formula (I) had the unexpected advantage of significant improvements in performance compared to polymers having regioregular and/or random A-D-A-D polymers. Without being bound by theory, in part, the improved performance may be attributed to improved intermolecular π-stacking interactions resulting in enhanced charge-carrier mobility.

The advantage of the polymers is particularly pronounced where the monomer unit A is non-symmetrical, the non-symmetrical unit A are symmetrically arranged about donor monomer units and the donor monomer units D1 and D2 differ. The donor monomer units may differ in respect of the core chromophore, the substituents or both core chromophore and substituents. Side-by-side comparisons of conjugated polymers -[A-D1-A-D2]$_n$- and corresponding polymers of formula -[A-D1-A-D1]$_n$-have shown that controlling the relative orientation of the A units in combination with providing two distinct donor units enhances the macromolecular interactions which in turn leads to a significant improvement in the short-circuit current densities of organic photovoltaic (OPVs) devices.

In a preferred set of embodiments the conjugated polymer is of formula (I) wherein the acceptor is an asymmetric group and the acceptor groups A are disposed with mutual symmetry about the donor group D1. Examples of such preferred donor groups include those of formula 4,6 (where Y and Z are different), 11 where Y and Z are different), 12 where Y and Z are different), 16, 19, 20 and 21. Preferred asymmetric acceptor groups, A, are selected from the group consisting of:

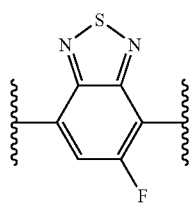
4

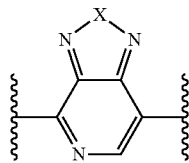
6a

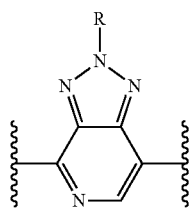
11a

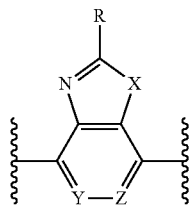
12

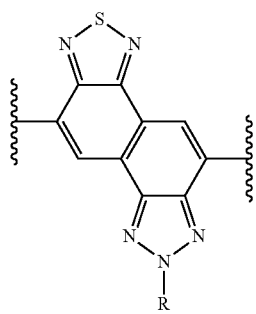
16

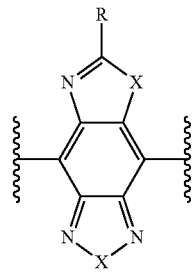
18

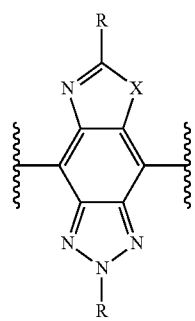
19

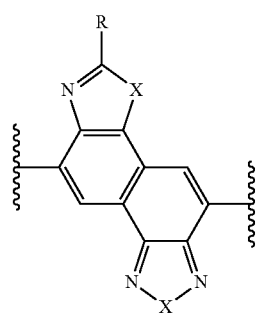
20
and

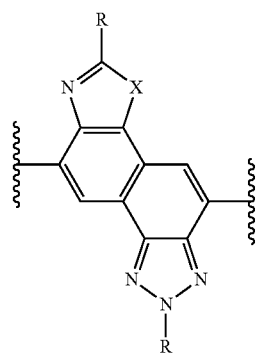
21 wherein

R is alkyl or aryl;

X is S or O;

Y and Z are independently selected from the group consisting of C—H, C—R, C—F, C—Cl, C—CF$_3$, C—CN, N, C—COOH, C—COOR and C—CONHR.

The most preferred acceptor A is:

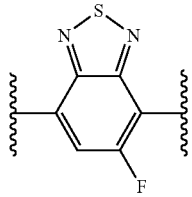

Preferred examples of donor groups D1 and D2, particularly for use with asymmetric acceptor unit A in the structural unit of formula (I) are different and each independently selected from the group consisting of:

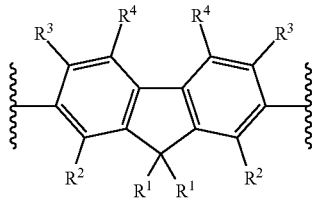
(IIIa)

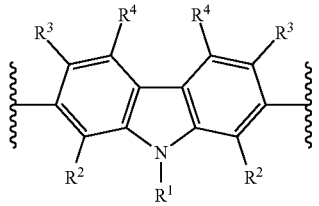
(IVa)

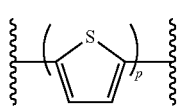
(Va)

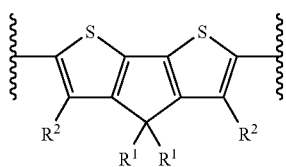
(VIa)

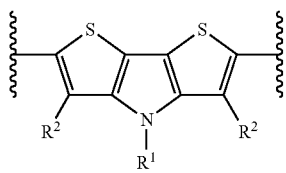
(VIIa)

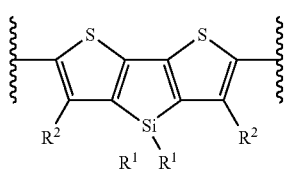

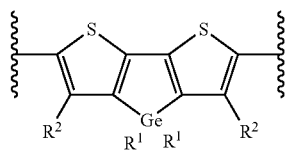
(IXb)

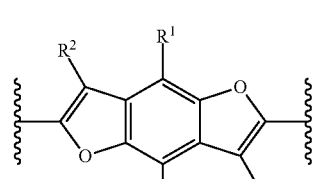
(IXc)

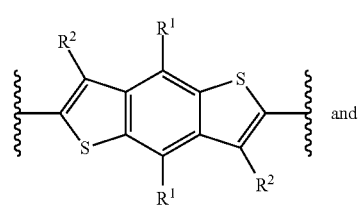
(VIIIa) and

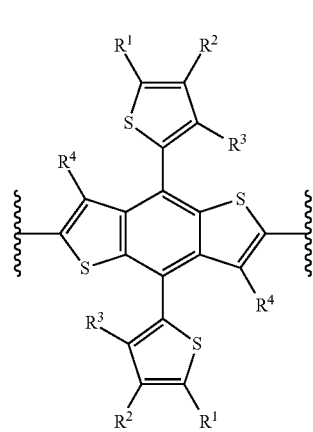
(Xa)

wherein
  $R^1$ to $R^4$ are independently selected from the group consisting of hydrogen, optionally substituted alkyl, optionally substituted alkenyl, optionally substituted alkynyl, optionally substituted carbocyclyl, optionally substituted aryl, and optionally substituted heterocyclyl; and p is an integer from 1 to 3.

In a particularly preferred embodiment D1 and D2 are different monomer units independently selected from structural units of formula (Xa)

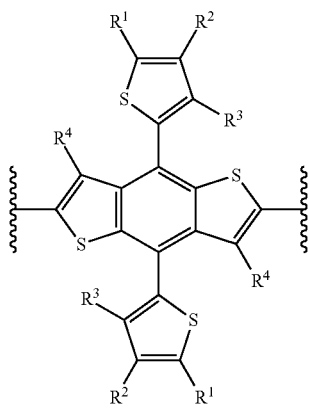

(Xa)

wherein

R¹ to R⁴ are independently selected from hydrogen, optionally substituted alkyl, optionally substituted alkenyl, optionally substituted alkynyl, optionally substituted carbocyclyl, optionally substituted aryl, and optionally substituted heterocyclyl. Preferably R³ or R⁴ are hydrogen and R¹ and R² are independently selected from hydrogen and optionally substituted alkyl and at least one of R¹ and R² is optionally substituted alkyl.

The particularly preferred conducting polymers of formula (I) are obtainable by polymerisation of a macromonomer comprising a structural unit of formula (XI) and a donor monomer, D2:

A-D1-A    (XI)

The polymerisation of a macromonomer A-D1-A with donor monomer D2 may be conducted using reactive terminal groups by a range of coupling reactions known in the art. In one set of embodiments the macromonomer of formula (XIa) is polymerised with a donor monomer of formula (XIII):

P-A-D1-A-P    (XIa)

Q-D2-Q    (XIII)

wherein P and Q are reactive coupling partners; and
wherein the acceptor groups, A, are disposed with mutual symmetry about donor group D1.

One specific embodiment of a macromonomer is of formula (XIb):

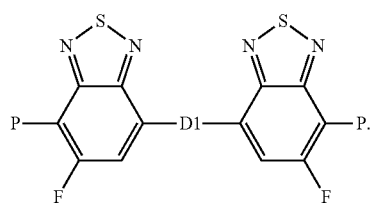

(XIb)

Examples of coupling partners include combinations wherein:
P is selected from the group consisting of bromine, iodine and pseudo-halides; and
Q is selected from the group consisting of alkenyl, —B(R⁵)₂, —BF₃K, —SiR⁶₃, —SnR₃, —MgP, —ZnCl, —ZnBr, —ZnI;

wherein
R is alkyl or aryl;
R⁵ is selected from the group consisting of R and (OR); and
R⁶ is chlorine, fluorine or alkyl.

Further examples of coupling partners include combinations wherein:
(b) P is selected from the group consisting of alkenyl, —B(R⁵)₂, —BF₃K, —SiR⁶₃, —SnR₃, —MgP, —ZnCl, —ZnBr, —ZnI;
Q is selected from the group consisting of bromine, iodine and pseudo-halides;
R is alkyl;
R⁵ is selected from the group consisting of R and (OR);
R⁶ is chlorine, fluorine or alkyl.

Particularly preferred pseudo-halide is selected from the group consisting of triflate, sulfonate and phosphonate.

In one specific embodiment the coupling partners are selected so that:
P is bromine; and
Q is —Sn(CH₃)₃.

In some embodiments the polymers may be synthesised by a transition metal catalysed cross coupling reaction.

In some embodiments the polymers may be synthesised by Stille cross coupling.

In some embodiments the polymers may be synthesised by Suzuki polycondensation.

In some embodiments the polymers may be prepared by a continuous synthesis process.

In a sixth aspect there is provided a photosensitive optoelectronic device comprising one or more of the hereinbefore disclosed conjugated polymers. By photosensitive it is meant that the conjugated polymer contributes to the photocurrent of any suitable device within which the conjugated polymer is employed.

In one form of the invention the compound may have p-type character within the device. In an alternant form of the invention, the compound may have n-type character within the device.

In some embodiments the device may comprise one or more species capable of acting as electron donors or electron acceptors.

Another component of the device may include a fullerene or a fullerene derivative.

In one form, the device may be a photovoltaic device.

In an alternate form, the device may be a photoconductive device.

In a further form, the device may be a photodetector.

The device may further comprise a pair of electrodes, and one or more layers of photosensitive semiconducting material between said electrodes. The layer or at least one of the layers of photosensitive material preferably includes at least one conjugated polymer as defined hereinbefore which is photosensitive and contributes to the photocurrent.

The device may comprise at least two layers of semiconducting materials provided between the electrodes, said layers forming a heterojunction and, preferably, at least one of said layers comprises a photosensitive semiconducting material which includes at least one conjugated polymer as defined hereinbefore.

Each of said at least two layers may include at least one conjugated polymer as defined hereinbefore.

Alternatively or additionally, the device may include one or more layers including at least one conjugated polymer as hereinbefore described which has another function instead of or in addition to at least partly generating a photocurrent, for example, a charge transfer layer.

In a further embodiment, the layer or at least one of the layers of photosensitive semiconducting material may include a mixture or blend of the conjugated polymer as hereinbefore defined and another organic semiconducting material.

In some embodiments there is provided advantageously soluble solution processable and/or vacuum deposited electron donating conjugated polymers useful for blending with electron accepting derivatives (such as fullerenes) in bulk heterojunction solar cells or fabricating layered heterojunction solar cells containing electron accepting fullerene derivatives.

The conjugated polymers are advantageously stable and can provide advantageous layered structures.

In some embodiments there is provided a use of the photovoltaic device in the generation of solar power.

There is also provided a high efficiency heterojunction solar cell based upon the conjugated polymers herein disclosed. Such cells may be useful in a wide variety of photovoltaic applications. In some embodiments heterojunction devices may be fabricated with one or more fullerenes. Preferred fullerenes are $PC_{61}BM$, $PC_{71}BM$ or mixtures thereof.

In some embodiments the devices display a high open circuit voltage $V_{oc}$ in the range 0.8-1.0 V. In other embodiments the devices display high energy conversion efficiencies.

Devices containing fullerene derivatives blended with the conjugated polymers as disclosed herein polymer show good device stability when thermally treated at up to 80-120° C. This is particularly advantageous for device fabrication in roll-to-roll printing where thermal treatment is often required for efficient layer by layer deposition of materials.

The conjugated polymers as disclosed hereinbefore provide more accurate control and design of the structure of repeating units in comparison with typical A-D type polymers, indicating obvious advantages in tailoring numerous polymer properties, including energy levels, side-chain sizes and lengths, backbone tacticity, intermolecular aggregates, thermal and chemical stabilities, polymer solubilities, processing conditions, etc.

Throughout this specification, use of the terms "comprises" or "comprising" or grammatical variations thereon shall be taken to specify the presence of stated features, integers, steps or components but does not preclude the presence or addition of one or more other features, integers, steps, components or groups thereof not specifically mentioned.

DETAILED DESCRIPTION

It will now be convenient to describe the invention with reference to particular embodiments and examples. These embodiments and examples are illustrative only and should not be construed as limiting upon the scope of the invention. It will be understood that variations upon the described invention as would be apparent to the skilled artisan are within the scope of the invention. Similarly, the present invention is capable of finding application in areas that are not explicitly recited in this document and the fact that some applications are not specifically described should not be considered as a limitation on the overall applicability of the invention.

In this specification "optionally substituted" is taken to mean that a group may or may not be substituted or fused (so as to form a condensed polycyclic group) with one, two, three or more of organic and inorganic groups (i.e. the optional substituent) including those selected from: alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, alkoxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheteroayl, nitrocarbocyclyl, nitroacyl, nitroaralkyl, amino (NH2), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate and phosphate groups.

Preferred optional substituents include alkyl, (e.g. C1-6 alkyl such as methyl, ethyl, propyl, butyl, cyclopropyl, cyclobutyl, cyclopentyl or cyclohexyl), hydroxyalkyl (e.g. hydroxymethyl, hydroxyethyl, hydroxypropyl), alkoxyalkyl (e.g. methoxymethyl, methoxyethyl, methoxypropyl, ethoxymethyl, ethoxyethyl, ethoxypropyl etc.) alkoxy (e.g. C1-6 alkoxy such as methoxy, ethoxy, propoxy, butoxy, cyclopropoxy, cyclobutoxy), halo, trifluoromethyl, trichloromethyl, tribromomethyl, hydroxy, phenyl (which itself may be further substituted e.g., by C1-6 alkyl, halo, hydroxy, hydroxyC1-6 alkyl, C1-6 alkoxy, haloC1-6alkyl, cyano, nitro OC(O)C1-6 alkyl, and amino), benzyl (wherein benzyl itself may be further substituted e.g., by C1-6 alkyl, halo, hydroxy, hydroxyC1-6alkyl, C1-6 alkoxy, haloC1-6 alkyl, cyano, nitro OC(O)C1-6 alkyl, and amino), phenoxy (wherein phenyl itself may be further substituted e.g., by C1-6 alkyl, halo, hydroxy, hydroxyC1-6 alkyl, C1-6 alkoxy, haloC1-6 alkyl, cyano, nitro OC(O)C1-6 alkyl, and amino), benzyloxy (wherein benzyl itself may be further substituted e.g., by C1-6 alkyl, halo, hydroxy, hydroxyC1-6 alkyl, C1-6 alkoxy, haloC1-6 alkyl, cyano, nitro OC(O)C1-6 alkyl, and amino), amino, alkylamino (e.g. C1-6 alkyl, such as methylamino, ethylamino, propylamino etc.), dialkylamino (e.g. C1-6 alkyl, such as dimethylamino, diethylamino, dipropylamino), acylamino (e.g. $NHC(O)CH_3$), phenylamino (wherein phenyl itself may be further substituted e.g., by C1-6 alkyl, halo, hydroxy hydroxyC1-6 alkyl, C1-6 alkoxy, haloC1-6 alkyl, cyano, nitro OC(O)C1-6 alkyl, and amino), nitro, formyl, —C(O)-alkyl (e.g. C1-6 alkyl, such as acetyl), O—C(O)-alkyl (e.g. C1-6alkyl, such as acetyloxy), benzoyl (wherein the phenyl group itself may be further substituted e.g., by C1-6 alkyl, halo, hydroxy hydroxyC1-6 alkyl, C1-6 alkoxy, haloC1-6 alkyl, cyano, nitro OC(O)C1-6alkyl, and amino), replacement of $CH_2$ with C.dbd.O, $CO_2H$, $CO_2$alkyl (e.g. C1-6 alkyl such as methyl ester, ethyl ester, propyl ester, butyl ester), $CO_2$-phenyl (wherein phenyl itself may be further substituted e.g., by C1-6 alkyl, halo, hydroxy, hydroxyl C1-6 alkyl, C1-6 alkoxy, halo C1-6 alkyl, cyano, nitro OC(O)C1-6 alkyl, and amino), $CONH_2$, CONHphenyl (wherein phenyl itself may be further substituted e.g., by C1-6 alkyl, halo, hydroxy, hydroxyl C1-6 alkyl, C1-6 alkoxy, halo C1-6 alkyl, cyano, nitro OC(O)C1-6 alkyl, and amino), CONHbenzyl (wherein benzyl itself may be further substituted e.g., by C1-6 alkyl, halo, hydroxy hydroxyl C1-6 alkyl, C1-6 alkoxy, halo C1-6 alkyl, cyano, nitro OC(O)C1-6 alkyl, and amino), CONHalkyl (e.g. C1-6 alkyl such as methyl ester, ethyl ester, propyl ester, butyl amide) CONHdialkyl (e.g. C1-6 alkyl)aminoalkyl (e.g., HN C1-6 alkyl-, C1-6alkylHN—C1-6 alkyl- and (C1-6 alkyl)$_2$N—C1-6 alkyl-), thioalkyl (e.g., HS C1-6 alkyl-), carboxyalkyl (e.g., $HO_2C$C1-6 alkyl-), carboxyesteralkyl (e.g., C1-6 alkyl$O_2C$C1-6 alkyl-), amidoalkyl (e.g., $H_2N(O)C$C1-6 alkyl-, H(C1-6 alkylON(O)CC1-6 alkyl-), formylalkyl (e.g., OHCC1-6alkyl-), acylalkyl (e.g., C1-6 alkyl(O)CC1-6 alkyl-), nitroalkyl (e.g., $O_2N$C1-6 alkyl-), sulfoxidealkyl (e.g., $R_3(O)S$C1-6 alkyl, such as C1-6 alkyl(O)SC1-6 alkyl-), sulfonylalkyl (e.g., $R_3(O)_2S$C1-6 alkyl- such as C1-6 alkyl(O)$_2$SC1-6 alkyl-), sulfonamidoalkyl (e.g., 2HRN(O)SC1-6 alkyl, H(C1-6 alkyl)N(O)SC1-6 alkyl-).

As used herein, the term "alkyl", used either alone or in compound words denotes straight chain, branched or cyclic alkyl, for example C1-40 alkyl, or C1-20 or C1-10. Examples of straight chain and branched alkyl include methyl, ethyl, n-propyl, isopropyl, n-butyl, sec-butyl, t-butyl, n-pentyl, n-hexyl, 1,2-dimethylpropyl, 1,1-dimethylpropyl, hexyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, heptyl, 5-methylhexyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethyl-pentyl, 1,2,3-trimethylbutyl, 1,1,2-trimethylbutyl, 1,1,3-trimethylbutyl, octyl, 6-methylheptyl, 1-methylheptyl, 1,1,3,3-tetramethylbutyl, nonyl, 1-, 2-, 3-, 4-, 5-, 6- or 7-methyloctyl, 1-, 2-, 3-, 4- or 5-ethylheptyl, 1-, 2- or 3-propylhexyl, decyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, dimethyloctyl, undecyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, dodecyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-2-pentylheptyl, tridecyl, tetradecyl, pentadecyl, hexadecyl, heptadecyl, octadecyl, nonoadecyl, eicosyl and the like. Examples of cyclic alkyl include mono- or polycyclic alkyl groups such as cyclopropyl, cyclobutyl, cyclopentyl, cyclohexyl, cycloheptyl, cyclooctyl, cyclononyl, cyclodecyl and the like. Where an alkyl group is referred to generally as "propyl", butyl" etc., it will be understood that this can refer to any of straight, branched and cyclic isomers where appropriate. An alkyl group may be optionally substituted by one or more optional substituents as herein defined.

As used herein, term "alkenyl" denotes groups formed from straight chain, branched or cyclic hydrocarbon residues containing at least one carbon to carbon double bond including ethylenically mono-, di- or polyunsaturated alkyl or cycloalkyl groups as previously defined, for example C2-40 alkenyl, or C2-20 or C2-10. Thus, alkenyl is intended to include propenyl, butylenyl, pentenyl, hexaenyl, heptaenyl, octaenyl, nonaenyl, decenyl, undecenyl, dodecenyl, tridecenyl, tetradecenyl, pentadecenyl, hexadecenyl, heptadecenyl, octadecenyl, nondecenyl, eicosenyl hydrocarbon groups with one or more carbon to carbon double bonds. Examples of alkenyl include vinyl, allyl, 1-methylvinyl, butenyl, isobutenyl, 3-methyl-2-butenyl, 1-pentenyl, cyclopentenyl, 1-methyl-cyclopentenyl, 1-hexenyl, 3-hexenyl, cyclohexenyl, 1-heptenyl, 3-heptenyl, 1-octenyl, cyclooctenyl, 1-nonenyl, 2-nonenyl, 3-nonenyl, 1-decenyl, 3-decenyl, 1,3-butadienyl, 1,4-pentadienyl, 1,3-cyclopentadienyl, 1,3-hexadienyl, 1,4-hexadienyl, 1,3-cyclohexadienyl, 1,4-cyclohexadienyl, 1,3-cycloheptadienyl, 1,3,5-cycloheptatrienyl and 1,3,5,7-cyclooctatetraenyl. An alkenyl group may be optionally substituted by one or more optional substituents as herein defined.

As used herein the term "alkynyl" denotes groups formed from straight chain, branched or cyclic hydrocarbon residues containing at least one carbon-carbon triple bond including ethylenically mono-, di- or polyunsaturated alkyl or cycloalkyl groups as previously defined, for example, C2-40 alkenyl, or C2-20 or C2-10. Thus, alkynyl is intended to include propynyl, butylynyl, pentynyl, hexaynyl, heptaynyl, octaynyl, nonaynyl, decynyl, undecynyl, dodecynyl, tridecynyl, tetradecynyl, pentadecynyl, hexadecynyl, heptadecynyl, octadecynyl, nondecynyl, eicosynyl hydrocarbon groups with one or more carbon to carbon triple bonds. Examples of alkynyl include ethynyl, 1-propynyl, 2-propynyl, and butynyl isomers, and pentynyl isomers. An alkynyl group may be optionally substituted by one or more optional substituents as herein defined.

An alkenyl group may comprise a carbon to carbon triple bond and an alkynyl group may comprise a carbon to carbon double bond (i.e. so called ene-yne or yne-ene groups).

As used herein, the term "aryl" (or "carboaryl") denotes any of single, polynuclear, conjugated and fused residues of aromatic hydrocarbon ring systems. Examples of aryl include phenyl, biphenyl, terphenyl, quaterphenyl, naphthyl, tetrahydronaphthyl, anthracenyl, dihydroanthracenyl, benzanthracenyl, dibenzanthracenyl, phenanthrenyl, fluorenyl, pyrenyl, idenyl, azulenyl, chrysenyl. Preferred aryl include phenyl and naphthyl. An aryl group may be optionally substituted by one or more optional substituents as herein defined.

As used herein, the terms "alkylene", "alkenylene", and "arylene" are intended to denote the divalent forms of "alkyl", "alkenyl", and "aryl", respectively, as herein defined.

The term "halogen" ("halo") denotes fluorine, chlorine, bromine or iodine (fluoro, chloro, bromo or iodo).

The term "carbocyclyl" includes any of non-aromatic monocyclic, polycyclic, fused or conjugated hydrocarbon residues, preferably C3-20 (e.g. C3-10 or C3-8). The rings may be saturated, e.g. cycloalkyl, or may possess one or more double bonds (cycloalkenyl) and/or one or more triple bonds (cycloalkynyl). Particularly preferred carbocyclyl moieties are 5-6-membered or 9-10 membered ring systems. Suitable examples include cyclopropyl, cyclobutyl, cyclopentyl, cyclohexyl, cycloheptyl, cyclooctyl, cyclononyl, cyclodecyl, cyclopentenyl, cyclohexenyl, cyclooctenyl, cyclopentadienyl, cyclohexadienyl, cyclooctatetraenyl, indanyl, decalinyl and indenyl.

The term "heterocyclyl" when used alone or in compound words includes any of monocyclic, polycyclic, fused or conjugated hydrocarbon residues, preferably C3-20 (e.g. C3-10 or C3-8) wherein one or more carbon atoms are replaced by a heteroatom so as to provide a non-aromatic residue. Suitable heteroatoms include O, N, S, P and Se, particularly O, N and S. Where two or more carbon atoms are replaced, this may be by two or more of the same heteroatom or by different heteroatoms. The heterocyclyl group may be saturated or partially unsaturated, i.e. possess one or more double bonds. Particularly preferred heterocyclyl are 5-6 and 9-10 membered heterocyclyl. Suitable examples of heterocyclyl groups may include azridinyl, oxiranyl, thiiranyl, azetidinyl, oxetanyl, thietanyl, 2H-pyrrolyl, pyrrolidinyl, pyrrolinyl, piperidyl, piperazinyl, morpholinyl, indolinyl, imidazolidinyl, imidazolinyl, pyrazolidinyl, thiomorpholinyl, dioxanyl, tetrahydrofuranyl, tetrahydropyranyl, tetrahydropyrrolyl, tetrahydrothiophenyl, pyrazolinyl, dioxalanyl, thiazolidinyl, isoxazolidinyl, dihydropyranyl, oxazinyl, thiazinyl, thiomorpholinyl, oxathianyl, dithianyl, trioxanyl, thiadiazinyl, dithiazinyl, trithianyl, azepinyl, oxepinyl, thiepinyl, indenyl, indanyl, 3H-indolyl, isoindolinyl, 4H-quinolazinyl, chromenyl, chromanyl, isochromanyl, pyranyl and dihydropyranyl.

The term "heteroaryl" includes any of monocyclic, polycyclic, fused or conjugated hydrocarbon residues, wherein one or more carbon atoms are replaced by a heteroatom so as to provide an aromatic residue. Preferred heteroaryl have 3-20 ring atoms, e.g. 3-10. Particularly preferred heteroaryl are 5-6 and 9-10 membered bicyclic ring systems. Suitable heteroatoms include, O, N, S, P and Se, particularly O, N and S. Where two or more carbon atoms are replaced, this may be by two or more of the same heteroatom or by different heteroatoms. Suitable examples of heteroaryl groups may include pyridyl, pyrrolyl, thienyl, imidazolyl, furanyl, benzothienyl, isobenzothienyl, benzofuranyl, isobenzofuranyl, indolyl, isoindolyl, pyrazolyl, pyrazinyl, pyrimidinyl, pyridazinyl, indolizinyl, quinolyl, isoquinolyl, phthalazinyl, 1,5-naphthyridinyl, quinozalinyl, quinazolinyl, quinolinyl, oxazolyl, thiazolyl, isothiazolyl, isoxazolyl, triazolyl, oxadialzolyl, oxatriazolyl, triazinyl, and furazanyl.

The term "acyl" either alone or in compound words denotes a group containing the agent C.dbd.O (and not being a carboxylic acid, ester or amide) Preferred acyl includes C(O)—Rx, wherein Rx is hydrogen or an alkyl, alkenyl, alkynyl, aryl, heteroaryl, carbocyclyl, or heterocyclyl residue. Examples of acyl include formyl, straight chain or branched alkanoyl (e.g. C1-20) such as, acetyl, propanoyl, butanoyl, 2-methylpropanoyl, pentanoyl, 2,2-dimethylpropanoyl, hexanoyl, heptanoyl, octanoyl, nonanoyl, decanoyl, undecanoyl, dodecanoyl, tridecanoyl, tetradecanoyl, pentadecanoyl, hexadecanoyl, heptadecanoyl, octadecanoyl, nonadecanoyl and icosanoyl; cycloalkylcarbonyl such as cyclopropylcarbonyl cyclobutylcarbonyl, cyclopentylcarbonyl and cyclohexylcarbonyl; aroyl such as benzoyl, toluoyl and naphthoyl; aralkanoyl such as phenylalkanoyl (e.g. phenylacetyl, phenylpropanoyl, phenylbutanoyl, phenylisobutylyl, phenylpentanoyl and phenylhexanoyl) and naphthylalkanoyl (e.g. naphthylacetyl, naphthylpropanoyl and naphthylbutanoyl); aralkenoyl such as phenylalkenoyl (e.g. phenylpropenoyl, phenylbutenoyl, phenylmethacryloyl, phenylpentenoyl and phenylhexenoyl and naphthylalkenoyl (e.g. naphthylpropenoyl, naphthylbutenoyl and naphthylpentenoyl); aryloxyalkanoyl such as phenoxyacetyl and phenoxypropionyl; arylthiocarbamoyl such as phenylthiocarbamoyl; arylglyoxyloyl such as phenylglyoxyloyl and naphthylglyoxyloyl; arylsulfonyl such as phenylsulfonyl and napthylsulfonyl; heterocycliccarbonyl; heterocyclicalkanoyl such as thienylacetyl, thienylpropanoyl, thienylbutanoyl, thienylpentanoyl, thienylhexanoyl, thiazolylacetyl, thiadiazolylacetyl and tetrazolylacetyl; heterocyclicalkenoyl such as heterocyclicpropenoyl, heterocyclicbutenoyl, heterocyclicpentenoyl and heterocyclichexenoyl; and heterocyclicglyoxyloyl such as thiazolyglyoxyloyl and thienylglyoxyloyl. The Rx residue may be optionally substituted as described herein.

The term "sulfoxide", either alone or in a compound word, refers to a group —S(O)Ry wherein Ry is selected from hydrogen, alkyl, alkenyl, alkynyl, aryl, heteroaryl, heterocyclyl, carbocyclyl, and aralkyl. Examples of preferred Ry include C1-20alkyl, phenyl and benzyl.

The term "sulfonyl", either alone or in a compound word, refers to a group $S(O)_2$—Ry, wherein Ry is selected from hydrogen, alkyl, alkenyl, alkynyl, aryl, heteroaryl, heterocyclyl, carbocyclyl and aralkyl. Examples of preferred Ry include C1-20alkyl, phenyl and benzyl.

The term "sulfonamide", either alone or in a compound word, refers to a group S(O)NRyRy wherein each Ry is independently selected from hydrogen, alkyl, alkenyl, alkynyl, aryl, heteroaryl, heterocyclyl, carbocyclyl, and aralkyl. Examples of preferred Ry include C1-20alkyl, phenyl and benzyl. In a preferred embodiment at least one Ry is hydrogen. In another form, both Ry are hydrogen.

The term, "amino" is used herein its broadest sense as understood in the art and includes groups of the formula NRARB wherein RA and RB may be any independently selected from hydrogen, alkyl, alkenyl, alkynyl, aryl, carbocyclyl, heteroaryl, heterocyclyl, aralkyl, and acyl. RA and RB, together with the nitrogen to which they are attached, may also form a monocyclic, or polycyclic ring system e.g. a 3-10 membered ring, particularly, 5-6 and 9-10 membered systems. Examples of "amino" include $NH_2$, NHalkyl (e.g. C1-20alkyl), NHaryl (e.g. NHphenyl), NHaralkyl (e.g. NHbenzyl), NHacyl (e.g. NHC(O)C1-20alkyl, NHC(O)phenyl), Nalkylalkyl (wherein each alkyl, for example C1-20, may be the same or different) and 5 or 6 membered rings, optionally containing one or more same or different heteroatoms (e.g. O, N and S).

The term "amido" is used here in its broadest sense as understood in the art and includes groups having the formula C(O)NRARsupB, wherein RA and RB are as defined as above. Examples of amido include C(O)$NH_2$, C(O)NHalkyl (e.g. C1-20alkyl), C(O)NHaryl (e.g. C(O)NHphenyl), C(O) NHaralkyl (e.g. C(O)NHbenzyl), C(O)NHacyl (e.g. C(O) NHC(O)C1-20alkyl, C(O)NHC(O)phenyl), C(O)Nalkylalkyl (wherein each alkyl, for example C1-20, may be the same or different) and 5 or 6 membered rings, optionally containing one or more same or different heteroatoms (e.g. O, N and S).

The term "carboxy ester" is used here in its broadest sense as understood in the art and includes groups having the formula $CO_2Rz$, wherein Rz may be selected from groups including alkyl, alkenyl, alkynyl, aryl, carbocyclyl, heteroaryl, heterocyclyl, aralkyl, and acyl. Examples of carboxy ester include $CO_2$C1-20alkyl, $CO_2$aryl (e.g. $CO_2$phenyl), $CO_2$aralkyl (e.g. $CO_2$ benzyl).

The term "heteroatom" or "hetero" as used herein in its broadest sense refers to any atom other than a carbon atom which may be a member of a cyclic organic group. Particular examples of heteroatoms include nitrogen, oxygen, sulfur, phosphorous, boron, silicon, selenium and tellurium, more particularly nitrogen, oxygen and sulfur.

The term "pseudohalide group" includes such groups as p-toluenesulfonate (tosylate), and trifluoromethanesulfonate (triflate), methanesulfonate (meslyate), nonaflate (ONf), and aryl diazonium salts such as $ArN_2^+X$ wherein X is halide, $BF_4$ or other suitable substituent. The aryl halide or pseudohalide can have two or more such halogen atoms with an atomic number greater than nine and/or pseudohalide groups, including combinations of halogen atoms and pseudohalide groups. However, when two or more such groups are present, the halogen atoms with an atomic number greater than nine and/or pseudohalide groups should all be different from each other. For example, when two such substituents are present, they may be a chlorine atom and a bromine atom, or an iodine atom and a tosylate group, or etc. It is preferred that there is only one chlorine atom, bromine atom, iodine atom, or pseudohalide group directly bound to the aryl ring of the aryl halide or pseudohalide. Aryl chlorides are more preferred as the aryl halide reactants. To prevent self-reaction, it is preferred that stannyl groups are not present on the aryl halide or pseudohalide. The preferred pseudo-halides are selected from the group consisting of triflate, sulfonate and phosphonate.

Possible device structures of devices in accordance with the present disclosure may comprise two electrodes. At least one of these electrodes is at least partially transparent. Between the two electrodes are disposed a layer or a series of layers of compounds, at least one of which contains at least one of the conjugated polymers described herein.

The absorption of the devices may be tuned to match the sun (for photovoltaic devices), to match the application (e.g. the absorption of a solar cell may be tuned for cosmetic reasons, e.g. to make a coloured wall that is also a solar cell). The absorption of the devices may also be tuned to match the sensing source (in photodetectors).

The materials in each of the layers may be deposited by, for example, vapour deposition or by solution processes.

The internal structure or morphology of each layer and/or interface and/or the device as a whole may be optimised/varied by techniques such as annealing/heating during deposition, annealing/heating after deposition, the addition of volatile additives which selectively solubilise one of the components plus other techniques known to those skilled in the art.

Examples of possible device structures are shown in the accompanying drawings.

BRIEF DESCRIPTION OF DRAWINGS

In the drawings:

Referring to FIG. 1, there is shown a bilayer photosensitive optoelectronic device 100 including a heterojunction device formed from a first semiconducting layer 101 and a second semiconducting layer 102 which meet at a heterojunction 103. The heterojunction device is sandwiched between first and second electrodes 104, 105. Optionally, charge transfer layers 106, 107 or blocking layers may be provided between the first and second electrodes 104, 105 and the respective first and second semiconducting layers 101, 102.

Figure 1:
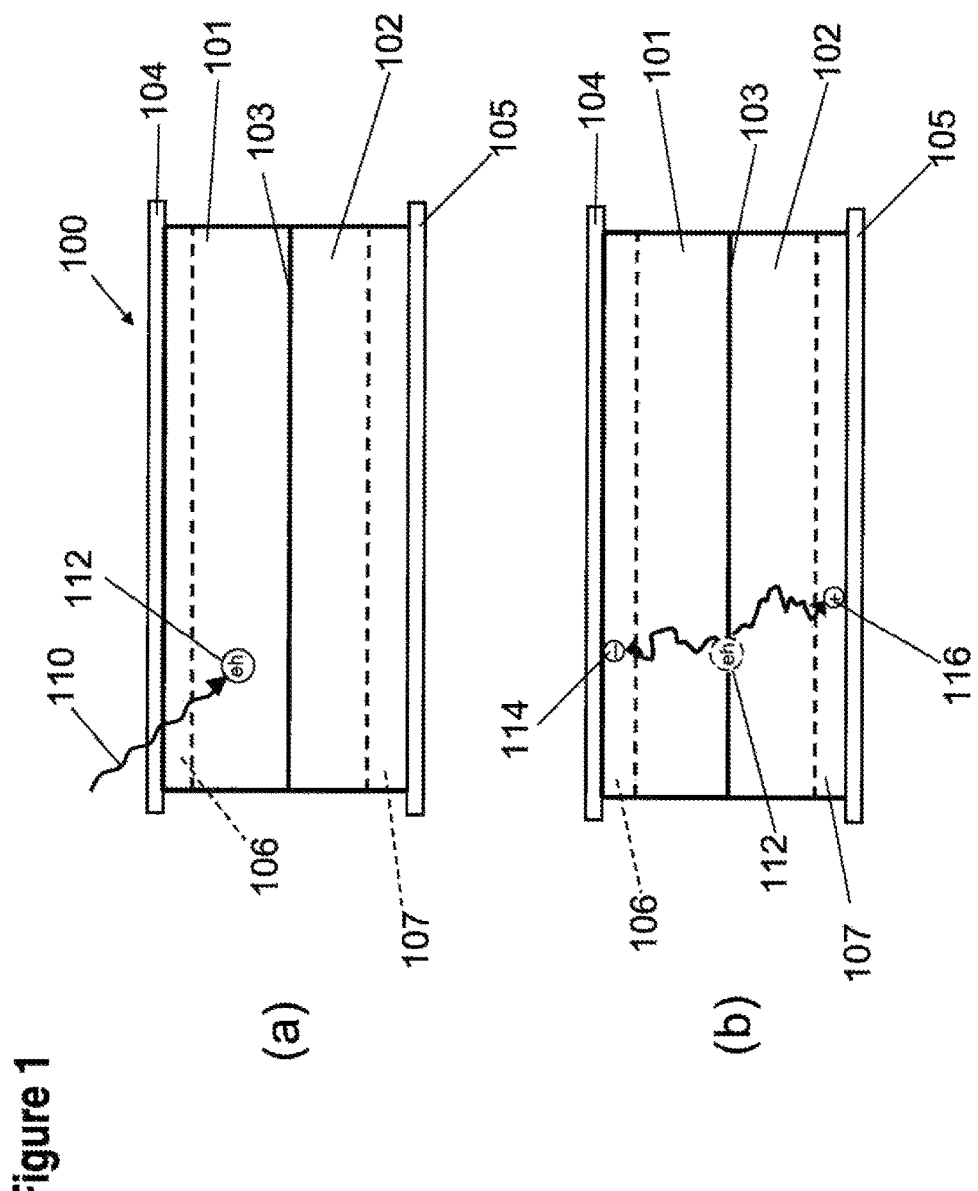
FIG. 1 is a schematic cross-section view of a bilayer photosensitive aptoelectronic device having a semiconducting layer comprising the conjugated polymer and includes FIG. 1(a) showing generation of an incitron to generate a current as shown in FIG. 1(b).

The first semiconducting layer 101 is a photosensitive layer which preferably includes a conjugated polymer as described above. The first semiconducting layer 101 may be an electron donor (n-type) material or an electron acceptor (p-type) material with the second semiconducting layer including an electron acceptor (p-type) or an electron donor (n-type) material. For the sake of convenience, as shown in FIG. 1, the semiconducting material of the first layer 101 is an electron transport material, and the semiconducting material of the second layer 102 is a hole transport material. The second semiconducting layer 102 may include any type of semiconducting material, but preferably includes an organic semiconducting material, such as a semiconducting polymer, small molecules or particles or nanoparticles of semiconducting materials.

In modified embodiments, the second semiconducting layer 102 and one or at least one of the optional layers 106, 107 may include a component as described above whose primary function is not to generate a photocurrent, e.g., transporting electrons or holes or charge transfer.

FIG. 1(a) shows the generation of an exciton 112 when a photon 110 with energy greater than Eg-Eb is absorbed in layer 101, where Eg is the band gap of layer 101 and Eb is the exciton binding energy. The exciton 112 diffuses to the heterojunction 103 where it dissociates to form an electron 114 and hole 116. Electron 114 percolates to the negative electrode (cathode) 104 and hole 116 to the positive electrode (anode) to generate a current as shown in FIG. 1(b).

Figure 2:
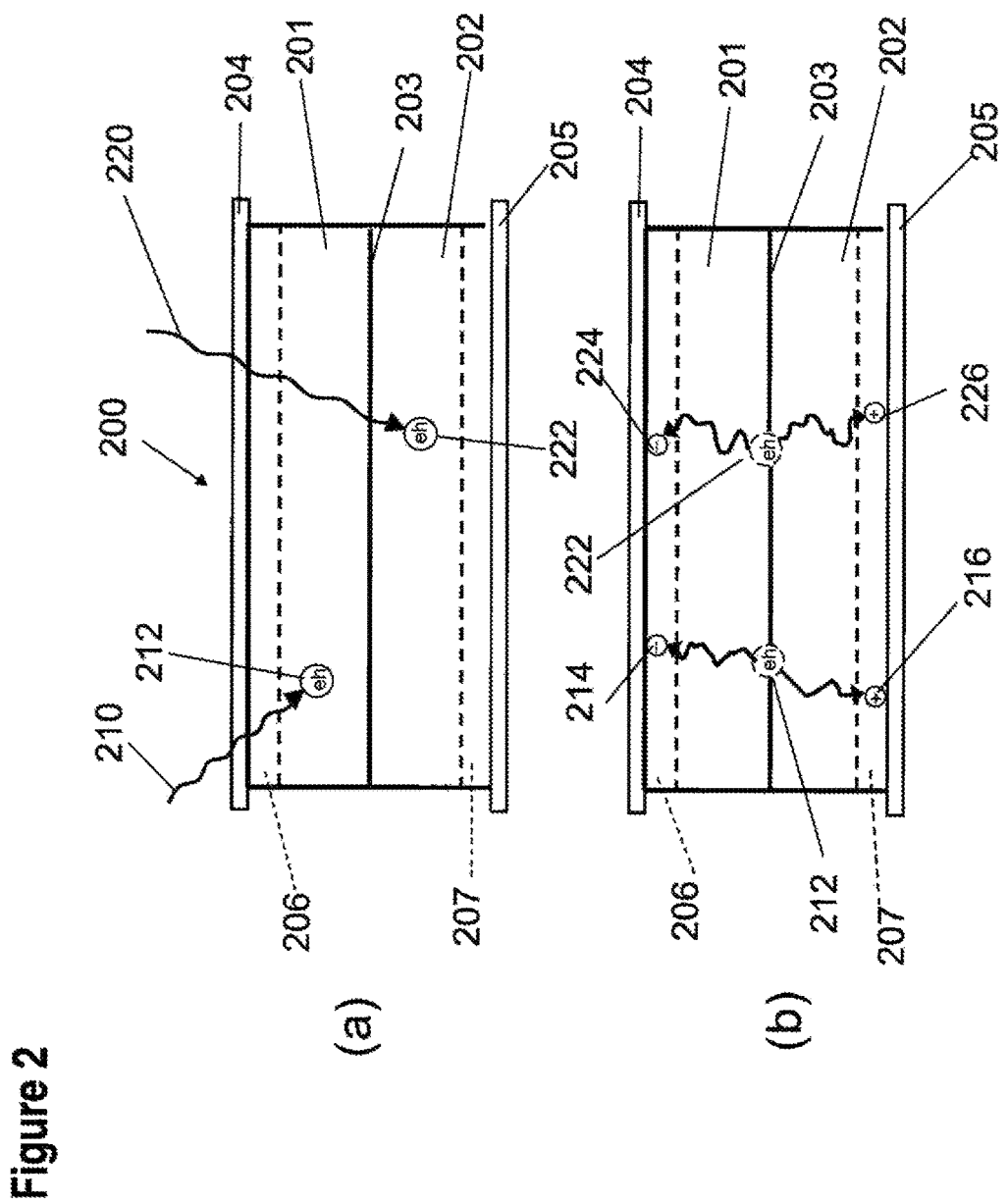
FIG. 2(a) and FIG. 2(b) are schematic cross-section views of a bilayer photosensitive optoelectronic device corresponding to FIG. 1 but differing in that both semiconducting layers are photosensitive layers.

The photosensitive optoelectronic bilayer device 200 of FIG. 2 is similar to that of FIG. 1 in that it has a heterojunction device formed from first and second semiconducting layers 201, 202 which meet at heterojunction 203 sandwiched between first and second electrodes 204, 205 with optional charge transfer/blocking layers 206, 207. The device 200 differs from that of FIG. 1 in that both semiconducting layers 201, 202 are photosensitive layers, and preferably at least one, more preferably both, of the layers includes a conjugated polymer as described hereinbefore. As shown, the first photosensitive layer 201 is an electron transport material which absorbs photons 210 within a first range of wavelengths (e.g. UV-visible) to product excitons 212. The second photosensitive layer 202 is a hole transport material which absorbs photons 220 within a second range of wavelengths (e.g. infrared) to produce excitons 222 (FIG. 2(a)). As in FIG. 1, the excitons 212, 222 migrate to the heterojunction 203 to form charge carriers in the form of electrons 214, 224 and holes 216, 226 which migrate to the electrodes 204, 205 to generate a current (FIG. 2(b)). As excitons 214,224 can be generated in both semiconducting layers 201, 202 to form charge carriers, there is a potential for greater currents to be generated resulting in greater efficiency.

Figure 3:
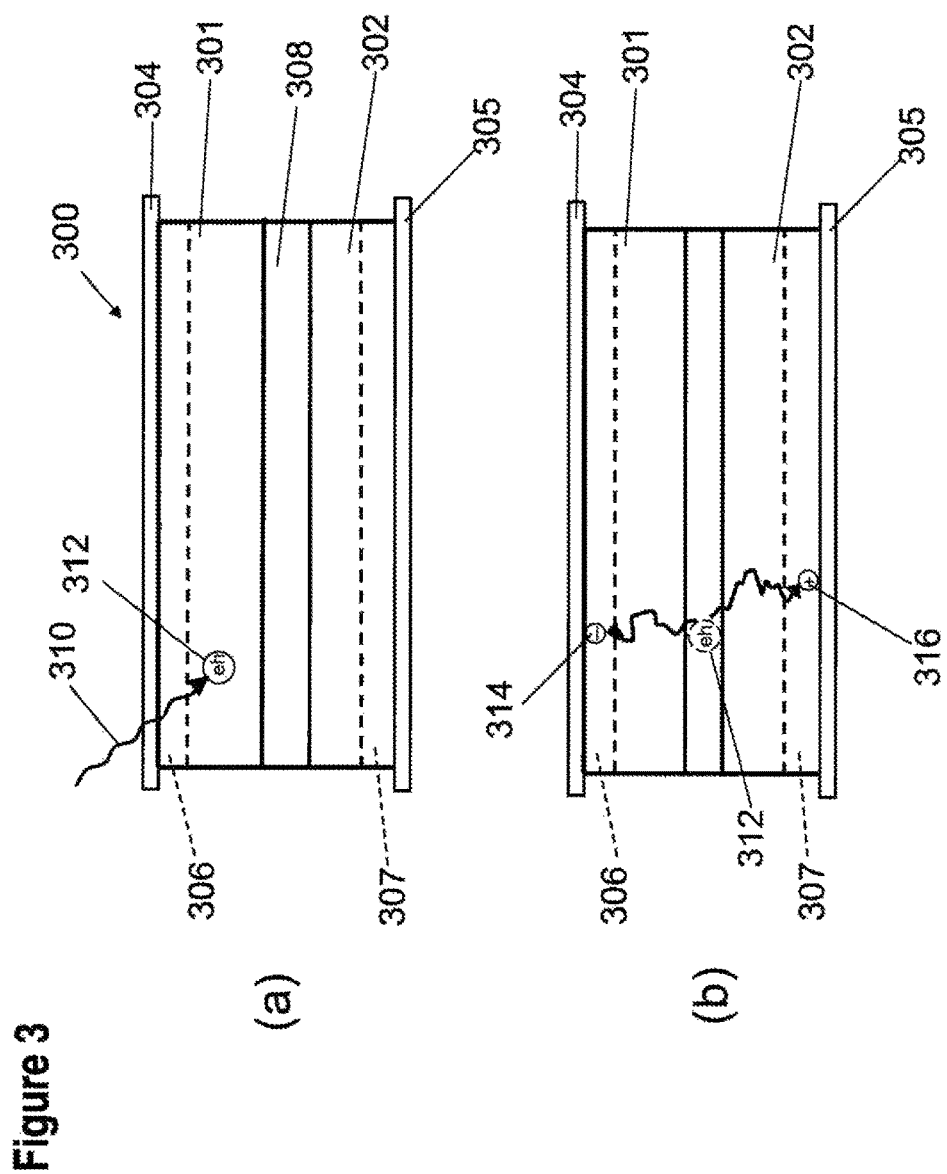
FIG. 3(a) and FIG. 3(b) schematic cross-sections of a bilayer device similar to corresponding drawing of FIG. 1 but differing in that the heterojunction device is a trilayer construction.

The photosensitive optoelectronic device 300 shown in FIG. 3 is similar to that of FIG. 1 in that it has a heterojunction device including first and second semiconducting layers 301, 302 sandwiched between electrodes 304, 305 with optional charge transfer/blocking layers 306, 307. The device 300 differs from FIG. 1 in that the heterojunction device is a trilayer construction with an interlayer 308 forming the heterojunction between the first and second semiconducting layers 301, 302.

As shown in FIG. 3, only the first semiconducting layer 301 includes a conjugated polymer as hereinbefore described which absorbs photons 310 to produce excitons 312 (FIG. 3(a)) that dissociate at the heterojunction interlayer 308 to form electrons 314 and holes 316. The second semiconducting layer 302 is formed from a hole transport material, though it will be appreciated that the layer 302 could also include a photosensitive material including, but not limited to, a conjugated polymer as hereinbefore described. The second layer 302 preferably includes an organic semiconducting material, such as a semiconducting polymer, small molecules or particles of semiconducting material. The interlayer 308 forming the heterojunction could be formed from a single semiconducting material or a mixture/blend of semiconducting materials. The semiconducting materials for interlayer 308 may include a compound described above, small molecules, polymers, particles and/or nanoparticles.

Figure 4:
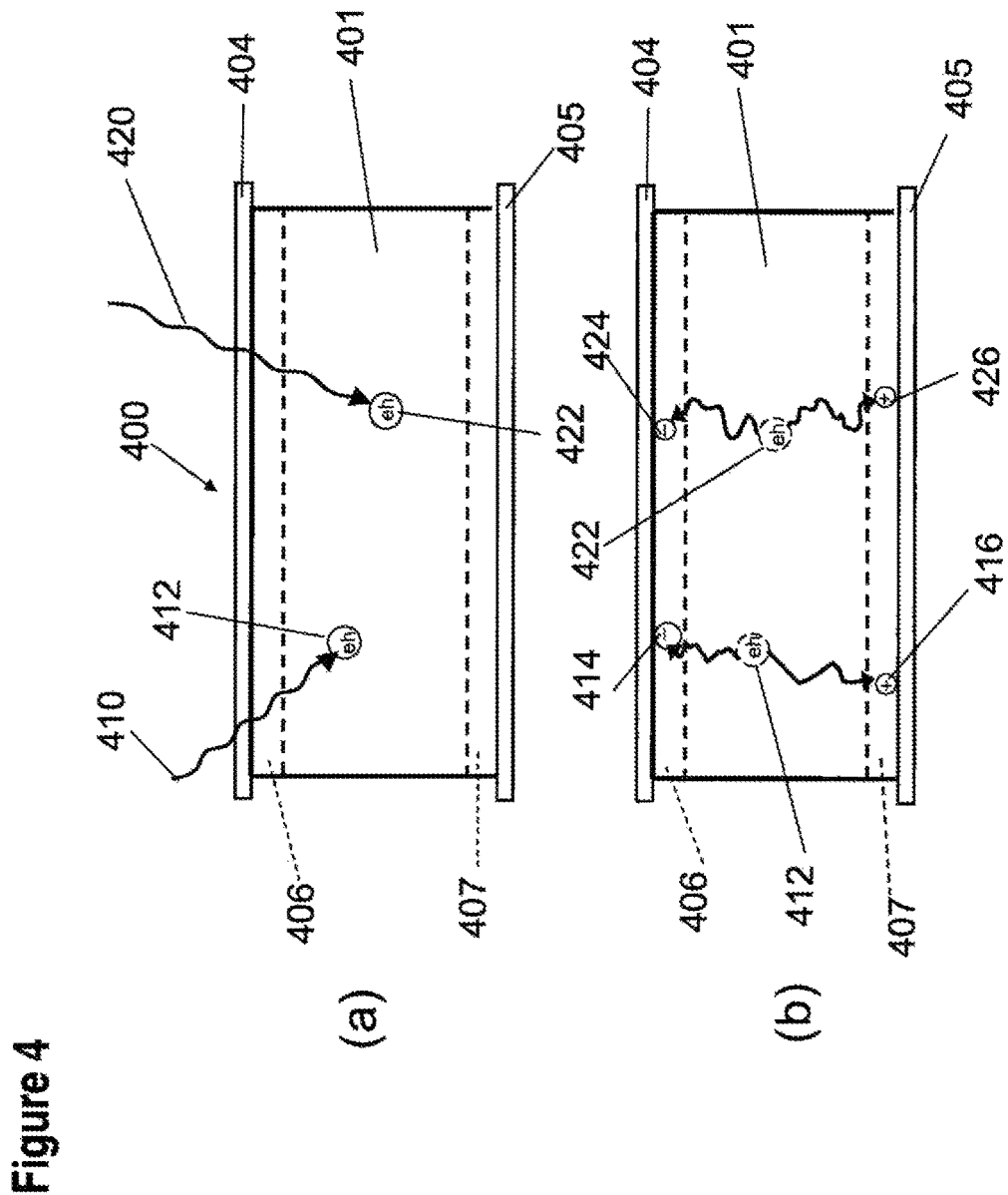
FIG. 4(a) and FIG. 4(b) are schematic cross-sections of photosensitive optoelectronic devices similar to previous figures but differing in that they contain optional change transfer/blocking layers.

The photosensitive optoelectronic device 400 of FIG. 4 differs from the previous devices in that a single photosensitive semiconducting layer 401 is sandwiched between electrodes 404, 405, with optional charge transfer/blocking layers 406, 407 between the layer 401 and the electrodes 404, 405. The photosensitive semiconducting layer 401 preferably includes at least one photosensitive material including a conjugated polymer as disclosed herein. The layer 401 may include a single compound, but is preferably a mixture or blend of a conjugated polymer as disclosed herein with another organic semiconducting material in the form of a polymer, small molecule or particles.

As shown in FIG. 4, the semiconducting layer 401 is preferably a mixture/blend including a first photosensitive material that absorbs photons 410 within a first range of wavelengths to produce excitons 412 and a second photosensitive material that absorbs photons 420 within a second range of wavelengths to product excitons 422 (FIG. 4(a)). The layer 401 preferably includes both acceptor (n-type) and donor (p-type) materials so that the heterojunction is within the semiconducting layer 401 itself. As shown in FIG. 4(b), the excitons 412, 422 dissociate within the layer 401 to form electrons 414, 424 and holes 416, 426 which migrate to the respective electrodes 404, 405 (through the optional charge transfer layers 406, 407 where provided) to generate a current.

The thicknesses of each of the semiconducting layers 101, 102; 201, 202; 301, 302; 401, 402 and the interlayer 308, where provided, will typically range from about 1 nm to about 500 nm, more preferably from about 10 nm to 300 nm, and most preferably from about 40 nm to 150 nm.

In further embodiments the devices may also include compounds as hereinbefore described in the form of nanocrystals or quantum dots. Additionally or alternatively, other materials in the form of nanocrystals or quantum dots may be present in addition to the conjugated polymers hereinbefore described.

Macromonomers and Polymers

Macromonomers and polymers were prepared as shown in Scheme 1. The synthesis procedures are described in the worked examples.

SCHEME 1:

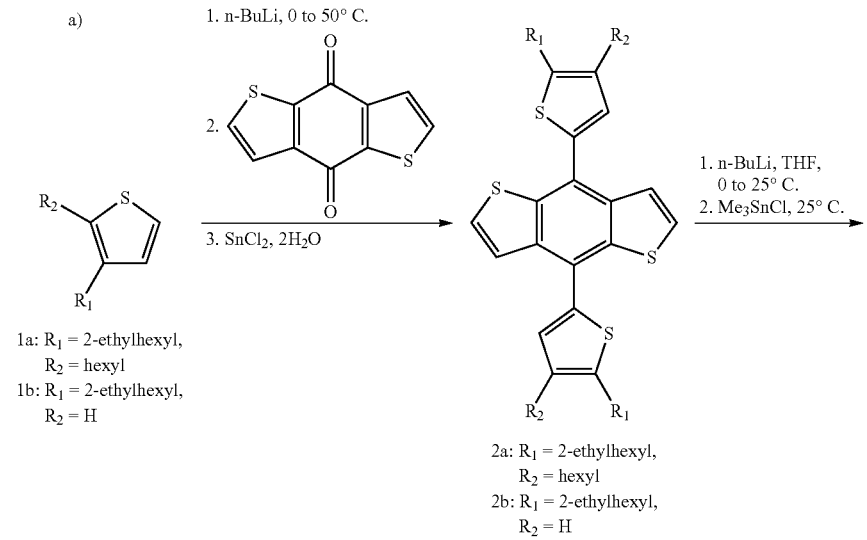

1a: $R_1$ = 2-ethylhexyl, $R_2$ = hexyl
1b: $R_1$ = 2-ethylhexyl, $R_2$ = H

2a: $R_1$ = 2-ethylhexyl, $R_2$ = hexyl
2b: $R_1$ = 2-ethylhexyl, $R_2$ = H

-continued
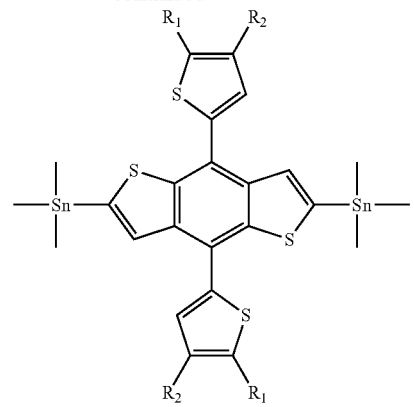
3a: R₁ = 2-ethylhexyl,
    R₂ = hexyl (D1)
3b: R₁ = 2-ethylhexyl,
    R₂ = H (D2)
b)
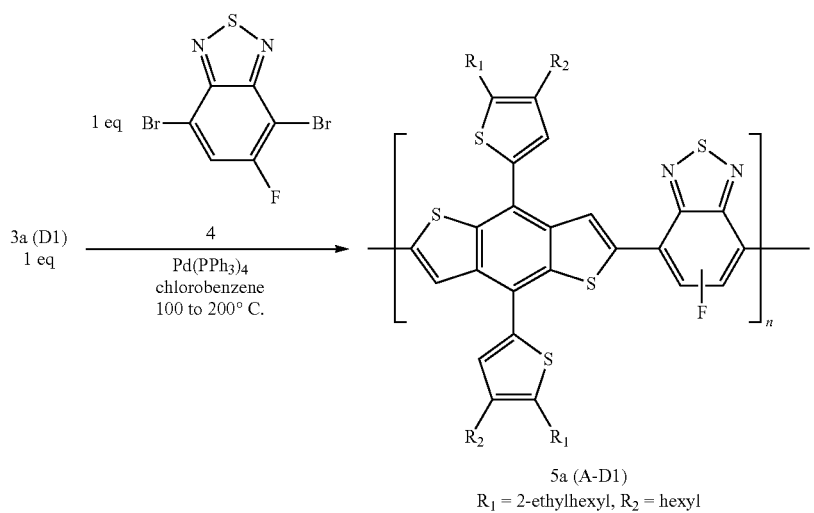
5a (A-D1)
R₁ = 2-ethylhexyl, R₂ = hexyl
c)
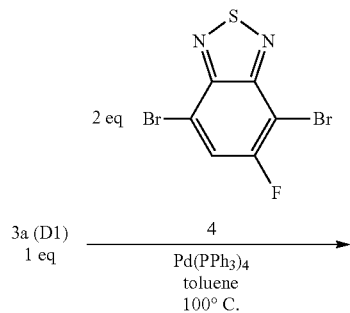

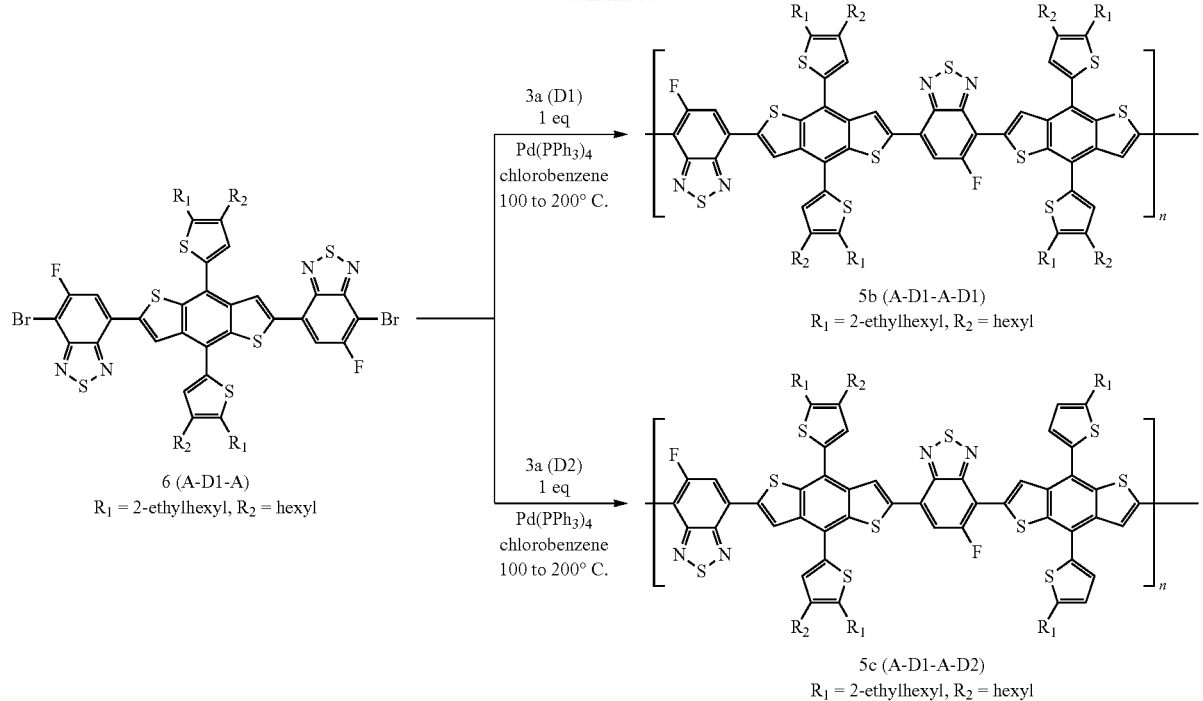

a) Synthesis of benzodithiophene monomer building blocks;
b) synthesis of random copolymer 5a typical A-D1 type) via Stille cross coupling and
c) synthesis of regioregular copolymer 5b (A-D1-A-D1 type) and 5c (A-D1-A-D2 type) via stepwise Stille cross-coupling and polycondensation.

The conjugated polymer tacticity can be controlled by using different synthesis strategies (Scheme 1). In part (a), two building blocks (3a and 3b) as electron-donating units (D1 and D2) with various substituted alkyl-chains are utilised, as well as 3,6-dibromo-5-fluoro-2,1,3-benzothiadiazole (4) as electron-accepting units (A). In part (b), by using a direct Stille cross-coupling polymerization between one equivalent of 3a (D1) and one equivalent of 4 (A), a copolymer 5a was prepared, in which the orientation of fluorine atoms on accepting units were not controlled, with bromine ortho to the fluorine or meta to the fluorine reacting randomly with compound 3a. All repeating units in the polymer backbone were completely randomly arranged as in traditional donor-acceptor copolymers [J. Am. Chem. Soc. 134, 14932-14944, (2012)]. Thus, 5a is defined as a random (A-D1) copolymer. In part (c), a step-wise cross-coupling strategy was devised based on the asymmetric reactivity of the bromine atoms on compound 4. Therefore, macromonomer 6 was first synthesized by coupling one equivalent of 3a (D1) with two equivalents of 4 (A). The bromine meta- to the fluorine substituent in 4 was selectively coupling with 3a. This proposed regiochemistry was confirmed by 2D NMR spectroscopy. Subsequently, the macro-monomer 6 (A-D1-A) was further reacted with one equivalent of 3a (D1) or 3b (D2) via a Stille cross-coupling polymerization, yielding copolymers 5b (A-D1-A-D1) and 5c (A-D1-A-D2), in which the orientation of the fluorine atoms on the accepting units was completely controllable. This stepwise synthesis strategy could afford a symmetric orientation of fluorine atoms on the accepting units in compound 6 and subsequently a defined, regio-controlled orientation of fluorine atoms in the polymer backbone of compounds 5b and 5c. The symmetric arrangement may result in stronger intermolecular interactions and thus significantly enhanced short-circuit current density (Jsc).

It is surprising that polymer 5c when synthesised by step-wise Stille cross coupling procedures exhibits number average molar mass properties (high temperature GPC-determined number average molar mass against polystyrene standards) of about 80,000-100,000 Daltons, whereas the polymer 5a prepared by traditional Stille polycondensation routinely affords material of number average molar mass of only 40,000 Daltons (by high temperature GPC against polystyrene standards).

Device Preparation and Performance

Organic photovoltaic devices (OPV's) were fabricated using the three polymers (5a, 5b and 5c) as electron donor and PC61BM as electron acceptor. The device structure consisted of ITO/PEDOT:PSS/polymer:PC61BM/PFN/Al. The optimized weight ratio of polymer to PC61BM is 1:1.4. About 2% (1,8-diiodooctane (DIO)/1,2-dichlorobenzene (DCB), v/v) of DIO was added as an additive for improved photovoltaic performance. There were no thermal pre- or post-annealing processes applied during the device fabrication. Device J-V characteristics are shown in FIG. 1 and parameters listed in Table 1.

The devices showed the following features:
(a) A high open circuit voltage VOC in the range 0.8-1.1 V
(b) A high fill factor in the range 55-75%
(c) A significantly improved short-circuit current density JSC from 7-9 mA/cm2 (5a), 10-12 mA/cm2 (5b) up to 14-18 mA/cm2 (5c).
(d) Surprisingly high energy conversion efficiencies for polymer 5c having A-D1-A-D2 type repeating units.
(e) Strong evidence for A-D1-A-D2 type conjugated polymers providing more accurate control and design of the structure of repeating units in comparison with typical A-D type polymers, indicating obvious advantages in tailoring numerous polymer properties, including energy levels, side-chain sizes and lengths, backbone tacticity, intermolecular aggregates, thermal and chemical stabilities, polymer solubilities, processing conditions, etc.

(f) Devices containing fullerene derivatives blended with polymer 5c show good device stability when thermally treated at up to 80-120° C. This is particularly advantageous for device fabrication in roll-to-roll printing where thermal treatment is often required for efficient layer by layer deposition of materials.

TABLE 1

Photovoltaic properties of the OPVs based on 5a-5c/PC$_{61}$BM and hole mobilities of the polymers.

| Polymer | $V_{OC}$ (V) | $J_{SC}$ (mA/cm$^2$) | FF (%) | PCE (%) Best | PCE (%) Ave[a] | $\mu_{hole}$ (cm$^2$V$^{-1}$s$^{-1}$)[b] |
|---|---|---|---|---|---|---|
| 5a | 0.89 | −7.25 | 60.56 | 3.91 | 3.74 | 2.3 × 10$^{-5}$ |
| 5b | 0.90 | −10.82 | 60.81 | 5.92 | 5.67 | 2.0 × 10$^{-4}$ |
| 5c | 0.90 | −14.20 | 61.05 | 7.80 | 7.38 | 1.5 × 10$^{-3}$ |

[a]Averaged from 40 devices.
[b]Measured by using the space-charge-limited current (SCLC) method.

Figure 5:
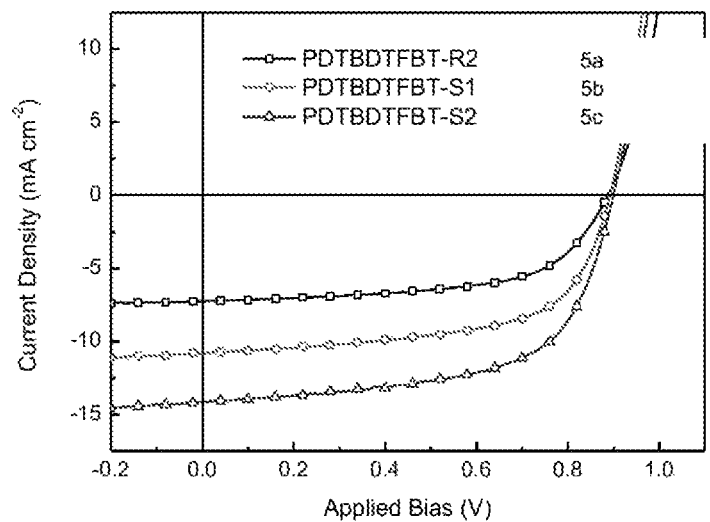
FIG. 5 is a graph showing the photocurrent density for a range of applied bias for polymers 5a, 5b and 5c.

FIG. 5 of the drawings shows the OPV performance of 5a-5c polymers. a, Photocurrent density-voltage (J-V) curves of 5a (square), 5b (round) and 5c (triangle) under illumination of AM 1.5G, 100 mW cm−2.

Figure 6:
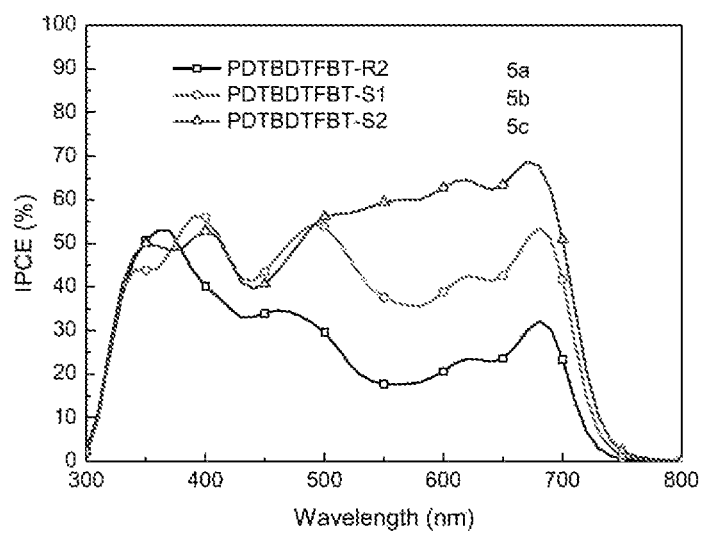
FIG. 6 is a graph showing the IPCE results of the polymers for a range of light wavelengths.

FIG. 6 of the drawings shows IPCE results of corresponding OPVs, 5a, 5b and 5c using the same identification.

Selection of material with number average molar mass in the range 75,000-100,000 Daltons affords surprisingly high solar cell device efficiencies. For example a solar cell device fabricated with conventional geometry configuration using a 1:1.4 w/w blend of polymer 5c with PC61BM exhibits energy conversion efficiency of 7.8% compared with efficiencies of 3.9% for 5a and 5.9% for 5b using exactly the same fabrication conditions.

It is expected that A-D1-A-D2 type conjugated polymers can replace typical A-D conjugated polymers, since the A-D1-A-D2 materials provide more controllable tailoring of polymer structures and thus more desirable bulk heterojunction morphology when blended with fullerene derivatives. Nanoscale domains with higher crystallinity may be present imparting improved charge transport. In addition, the A-D1-A-D2 conjugated polymers give higher molecular weight compared with traditional A-D polymers. This makes the material particularly suited for roll-to-roll fabrication of large area solar cell devices.

Improving the $J_{SC}$ value of a photovoltaic device by means of molecular design has been realized using a stepwise approach. Applying asymmetric fluorine substitution to the building block has been proven to be an effective method to control the tacticity of polymer backbones as well as the size of pendant groups, which directly affects the intermolecular packing and interactions in a polymer/fullerene bulk-heterojunction layer. The well-ordered morphology in the polymer domain can dramatically increase the charge carrier mobility and thus $J_{SC}$ value. Based on the 5c polymer and PC$_{61}$BM derivative system, photovoltaic devices with a PCE higher than 7% have been realised through design of a high performance polymer.

In one embodiment, the inventors have found that a conjugated polymer having a structure of formula (I) comprising asymmetric fluorine acceptors exhibit improved performance over typical A-D-A-D type conjugated polymers (regioregular or random). The regioregular polymers of formula (I) enables variations in the donor moieties which allows tailoring of polymer regiochemistry and solubility. Without being bound by theory, the improved performance, in part may be attributed to improved intermolecular π-stacking interactions which enhance charge-carrier mobility and is supported by X-ray diffraction measurements.

X-Ray Diffraction in Bulk Solid State

Figure 7:
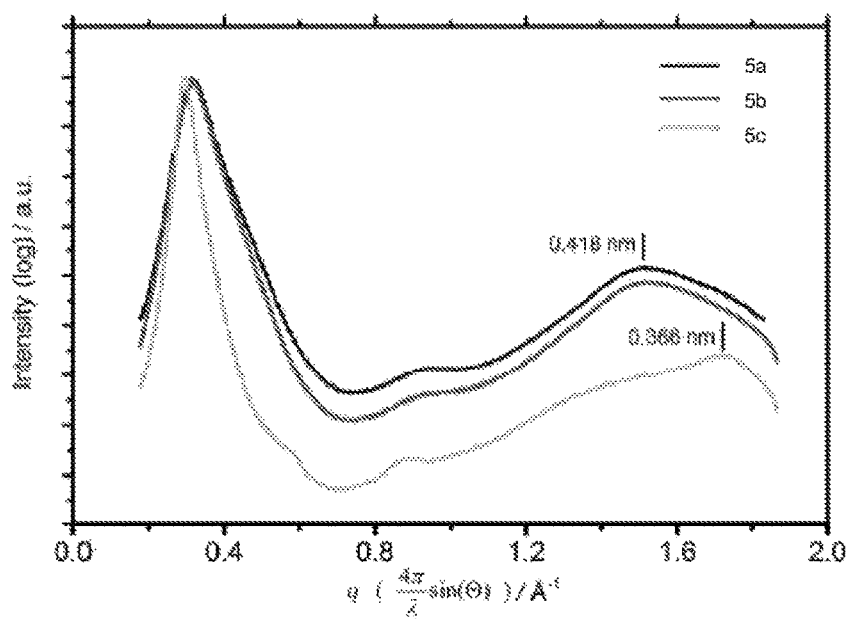
FIG. 7 shows 2DWAXS integrations for polymers 5a, 5b and 5c.

Random copolymer 5a and regioregular copolymers 5b and 5c in the bulk solid state were characterised using two-dimensional, wide angle X-ray scattering (2D-WAXS) techniques. The measurement procedures are described in the worked examples. Fibres of the neat polymers 5a-c were macroscopically aligned by extrusion and no further thermal pre- or post-annealing processes were performed in order to ensure the polymers undergo the same thermal treatment during device fabrication. The polymers at 30° C. exhibited characteristic reflections distributed in the equatorial and meridional planes. FIG. 7 shows 2DWAXS integrations for polymers 5a, 5b and 5c Polymers 5a and 5b showed equatorial small-angle reflections which were attributed to a chain-to-chain distance of 19.65 Å, the broad equatorial wide-angle scattering reflection (on the same plane) was attributed to a stacking distance of 4.18 Å and the meridional, middle-angle scattering reflection exhibited a d-spacing distance of 12.0 Å for 5a and 12.65 Å for 5b, corresponding to the single thienyl-dithiophene repeat unit distance.

In contrast, polymer 5c exhibited sharper, more distinct and a higher number of reflections with a chain-to-chain distance of 24.51 Å and a significantly smaller stacking distance of 3.66 Å. Polymer 5c exhibited a similar single thienyl-dithiophene repeat unit distance of 12.8 Å. Therefore, 2D-WAXS measurements show significantly closer packing and higher crystallinity for regioregular asymmetric polymer 5c.

X-Ray Diffraction on Thin Films

Figure 8:
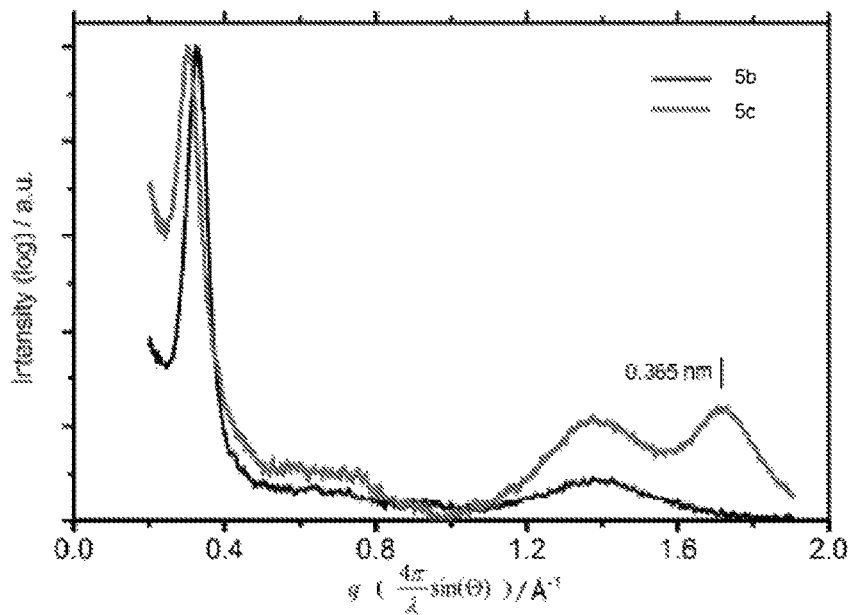
FIG. 8 shows GIWAXS integrations along the meridional plane. The stacking peak of 5c is indicated at the plot.

Thin films of polymers 5a-c were prepared to analyse their surface organisation in the solar cell. The thin films were prepared in the same manner as for the devices including the PEDOT:PSS surface, blending with PC61BM and 1,8-diiodooctane to replicate polymer organisation in an OPV device. Grazing incidence WAXS (GIWAXS) on the thin films using the polymers 5a-c was performed. The meridional position of the wide-angle scattering intensity at qxy=0 Å−1 and qz=1.72 Å−1 in the spectra for 5c as shown in FIG. 6 was attributed to a stacking distance of 3.66 Å, which is characteristic for a face to face arrangement of the backbones toward the surface. In accordance with this alignment the chain-to-chain reflections appeared in the small-angle equatorial plane. Additional meridional small-angle reflections were due to an edge-on arrangement of a certain misaligned polymer fraction leading to a mixed organisation with a coexistent face- and edge-on arrangement in the film. Without being bound by theory, it is possible that a face-on polymer arrangement favors the charge carrier transport perpendicular to the solar cell surface as is the case in a solar cell device. In contrast, 5a and 5b exhibit only a meridional small-angle scattering reflection and no π-stacking reflection indicating low order in edge-on arranged polymer layers. Therefore, with respect to both factors, X-ray diffraction data shows better packing and face-on arrangement for polymer 5c which may be more optimised for solar cell applications and shows improved performance. FIG. 8 *b* shows the GIWAXS integrations along the meridional plane.

EXAMPLES

Example 1

Monomer Synthesis

2-Ethylhexyl-3-hexyl thiophene (1a)

100 mL of (2-ethylhexyl) magnesium bromide (1.0M in diethyl ether) solution was added dropwise to a reaction mixture of 22 g (0.09 mol) of 2-bromo-3-hexylthiophene, and 0.001 mol Ni(dppp)Cl$_2$ in 50 mL of anhydrous THF cooled in an ice bath. After addition, the brown solution was allowed to warm to room temperature, with stirring. An exothermic reaction starts within 30 minutes, and the ether begins to reflux gently. After stirring for 2 hours at room temperature, most of the magnesium bromide salt has deposited. The mixture is refluxed with stirring for overnight. Upon cooling to room temperature, the reaction mixture was poured into a mixture of crushed ice and diluted HCl (2N) and extracted from ether. The combined organic layer was dried over MgSO$_4$. After filtration, the solvent was removed by rotary evaporation to afford brown oil that was purified by column chromatography on silica gel with n-heptane as eluent. The final product was obtained by using distillation under high vacuum, providing 20.0 g colourless oil in yield 87%.

$^1$H NMR (400 MHz, CDCl$_3$) δ 7.01 (d, J=5.2Hz, 1H), 6.791 (d, J=5.2 Hz, 1H), 2.63 (d, J=7.1 Hz, 2H), 2.52-2.43 (m, 2H), 1.73-1.41 (m, 3H), 1.36-1.10 (m, 14H), 0.95-0.80 (m, 9H). $^{13}$C NMR (100 MHz, CDCl$_3$) δ 138.38, 137.72, 128.51, 121.09, 41.71, 32.51, 31.96, 31.73, 30.82, 29.24, 28.86, 28.32, 25.65, 23.02, 22.61, 14.09, 14.06, 10.84.

4,8-Di(2-(2-ethylhexyl)-3-hexylthiophen-5-yl)-benzo[1,2-b:4,5-b']dithiophene (2a)

Compound 1a (8.4 g, 30 mmol) was dissolved in anhydrous THF (30 mL) in a three-neck flask under an argon atmosphere. The solution was cooled to 0° C., and a solution of n-BuLi (1.6 M in hexane, 20 mL, 32 mmol) was added dropwise with stirring. The reaction mixture was then heated to 50° C. for 2 hours. Subsequently, 4,8-dehydrobenzo[1,2-b:4,5-b']dithiophene-4,8-dione (2.20 g, 10 mmol) was quickly added, and the reaction mixture was stirred at 50° C. for 2 hours. Then the reaction mixture was cooled to ambient temperature. A solution of SnCl$_2$ (15.2 g, 80 mmol) in 10% HCl (20 mL) was then added. The reaction mixture was stirred for an additional 1.5 hours and poured into ice water. The mixture was extracted twice with petroleum ether. The organic phase was dried over MgSO$_4$ and concentrated. The crude product was purified by silica gel chromatography using petroleum ether as the eluent to yield the pure product as a yellowish viscous solid (5.23 g, 70% yield).

$^1$H NMR (400 MHz, CDCl$_3$) δ 7.66 (d, J=5.7 Hz, 2H), 7.43 (d, J=5.7 Hz, 2H), 7.20 (s, 2H), 2.73 (d, J=7.1 Hz, 4H), 2.64-2.49 (m, 4H), 1.62 (m, 6H), 1.47-1.22 (m, 28H), 0.99-0.85 (m, 18H). $^{13}$C NMR (100 MHz, CDCl$_3$) δ 139.14, 138.82, 138.79, 138.76, 136.32, 135.30, 129.69, 127.26, 124.11, 123.53, 41.71, 32.66, 32.23, 31.77, 30.79, 29.23, 28.92, 28.42, 25.90, 23.03, 22.65, 14.14, 14.12, 14.09, 10.94. m/z (MALDI-TOF) 745.8 calcd. for C$_{46}$H$_{66}$S$_4$ 746.4.

2,6-Bis(trimethyltin)-4,8-di(2-(2-ethylhexyl)-3-hexylthiophen-5-yl)-benzo[1,2-b:4,5-b'] dithiophene (3a)

Compound 2a (5.0 g, 6.7 mmol) was dissolved anhydrous THF (60 mL) in a two-neck flask under the protection of argon. The solution was cooled to 0° C., and a solution of n-BuLi (1.6 M in hexane, 10 mL, 16 mmol) was added dropwise with stirring. After this addition, the reaction mixture was warmed to ambient temperature and stirred for 2 hours. Then the reaction mixture was cooled to 0° C. and a SnMe$_3$Cl solution (1 M in THF, 20 mL, 20 mmol) was added in one portion. The reaction mixture was stirred at 0° C. for 30 minutes and then warmed to room temperature for 8 hours. Subsequently, the reaction mixture was pour into petroleum ether, washed by KF saturated aqueous solution twice and water twice. Then, the organic layer was dried over MgSO$_4$ and concentrated to afford the yellow crude product. The crude product was further purified by recycle GPC system and finally afforded straw yellow sheet-shaped crystals (6.4 g, 89% yield).

$^1$H NMR (400 MHz, CDCl$_3$) δ 7.76 (s, 2H), 7.26 (s, 2H), 2.77 (d, J=7.1 Hz, 4H), 1.90-1.86 (m, 4H), 1.71-1.67 (m, 2H), 1.50-1.35 (m, 32H), 1.00-0.92 (m, 18H), 0.42 (s, 18H). $^{13}$C NMR (100 MHz, CDCl$_3$) δ 145.37, 143.08, 141.89, 138.78, 138.64, 138.62, 137.14, 135.99, 131.38, 129.61, 127.51, 125.25, 122.46, 41.66, 32.68, 32.28, 31.84, 30.77, 29.19, 28.95, 28.40, 25.98, 23.06, 23.02, 22.67, 14.15, 14.13, 11.00, 10.95. m/z (MALDI-TOF) 1071.5 calcd. for C$_{52}$H$_{82}$S$_4$Sn$_2$ 1072.3.

The synthesis of the compound 3b was performed using 2-ethylhexyl thiophene 1b under the same conditions as for 3a, reported by Huo, L. J. et al [*Angew. Chem. Int. Ed.* 50, 9697-9702 (2011)].

The synthesis of the compound 4 was as published by Van der Poll, T. S. et al [*Adv. Mater.* 24, 3646-3649 (2012)].

2,6-(Bis-4-(6-fluoro-7-bromo)benzo[c][1,2,5]thiadiazole))-4,8-di(2-(2-ethylhexyl)-3-hexyl thiophen-5-yl)-benzo[1,2-b:4,5-b']dithiophene (6, A-D1-A)

Compound 3a (2.15 g, 2 mmol) and 4 (1.56 g, 5 mmol) were dissolved in toluene (100 mL) in a two-neck flask under the protection of argon. After adding Pd(PPh$_3$)$_4$ (115 mg, 0.1 mmol) as catalyst, the reaction mixture was stirred and heated to reflux for 16 h. The solution was poured into water (50 mL) with vigorous stirring and the aqueous layer was extracted with dichloromethane. The combined organic layer was dried with MgSO$_4$ and then rotary evaporated to remove the solvent. The dark red crude product was purified by column chromatography on silica gel with dichloromethane/n-heptane (40:60) as eluent, affording purple crystals as pure product (2.2 g, 90% yield).

$^1$H NMR (500 MHz, C$_2$D$_2$Cl$_4$, 120° C.) δ 8.95 (s, 2H), 7.79 (d, J=9.8 Hz, 2H), 7.44 (s, 2H), 2.91 (d, J=6.7 Hz, 4H), 2.76 (t, J=7.4 Hz, 4H), 1.83 (d, J=7.1 Hz, 4H), 1.60-1.56 (m, 12H), 1.52-1.35 (m, 18H), 1.08-1.05 (t, J=7.3 Hz, 6H), 1.01-0.92 (m, 12H). $^{13}$C NMR (125 MHz, C$_2$D$_2$Cl$_4$, 120° C.) δ 161.50, 159.50, 154.36, 149.15, 139.98, 139.16, 139.04, 138.26, 137.97, 134.44, 130.31, 127.61, 127.53, 126.97, 125.03, 117.71, 117.46, 97.50, 97.30, 41.76, 33.01, 32.54, 31.57, 30.45, 29.00, 28.94, 28.36, 26.30, 22.76, 22.34, 13.66, 13.63, 10.90. m/z (MALDI-TOF) 1208.0 calcd. for C$_{58}$H$_{66}$Br$_2$F$_2$N$_4$S$_6$ 1208.2.

General Method of Stille-Coupling Polymerization for Random Polymers

In a glove box, the monomer 3a (or 3b) (1 mmol) and monomer 4 (1 mmol) were mixed in a microwave reaction tube. After being dissolved in 5 mL of chlorobenzene, Pd(PPh$_3$)$_4$ (50 μmol) was added as the catalyst, and the tube was sealed with a Teflon® cap. The reaction mixture was heated to 100° C. for 1 minute, 135° C. for 1 minute, 170° C. for 1 hour, and 200° C. for 20 minutes using a Biotage microwave reactor. Then the achieved polymer was end-capped by reacting with 0.2 mL 2-(tributylstannyl)thiophene and 0.2 mL 2-bromothiophene at 170° C. for 20 minutes, respectively. The end-capped polymer was precipitated by addition of 50 mL methanol, filtered through a Soxhlet thimble. The precipitate was then subjected to Soxhlet extraction with acetone, ethyl acetate, n-heptane, dichloromethane and chloroform. The polymer was recovered as solid from the chloroform fraction by precipitation from methanol. The solid was dried under vacuum. The yield and HT-GPC results of the polymers are sown below.

General Method of Stille-Coupling Polymerization for Symmetric Polymers

In a glove box, the monomer 3b (0.5 mmol) and monomer 6 (0.5 mmol) were mixed in a microwave reaction tube. After being dissolved in 5 mL of chlorobenzene, Pd(PPh$_3$)$_4$ (50 μmol) was added as the catalyst, and the tube was sealed with a Teflon® cap. The reaction condition and purification process were similar to random polymers. The yield and HT-GPC results of the polymers are as follows.

5a (A-D1). Yield 76%, dark purple solid, M$_n$=31 kDa, PDI=2.2, T$_d$=390° C.

5b (A-D1-A-D1). Yield 87%, dark purple solid, M$_n$=46 kDa, PDI=2.2, T$_d$=397° C.

5c (A-D1-A-D2). Yield 89%, dark purple solid, M$_n$=76 kDa, PDI=2.2, T$_d$=400° C.

Device Fabrication and Characterization

OPV Device Preparation: ITO-coated glass substrates (Lumtec, 5Ω sq$^{-1}$) were cleaned by successively sonicating in detergent, Milli-Q water, acetone and iso-propanol (each 10 min). The substrates were then exposed to a UV-ozone clean (Novascan PDS-UVT, 10 min). PEDOT/PSS (HC Starck, Baytron P Al 4083) was filtered (0.2 μm RC filter) and deposited by spin-coating (5000 rpm, 20 s). The PEDOT/PSS layer was then annealed on a hotplate in air (150° C., 10 min).

For devices with spin-coated active layers, PDTBDTFBT polymer and PC$_{61}$BM (w/w=1:1.4) were dissolved in 1,2-dichlorobenzene (Aldrich, anhydrous) with 2% (v/v) DIO as additive and deposited onto PEDOT:PSS coated substrates inside a glovebox by static spin-coating (900 rpm, 2 mins). The concentration and spin speed were optimised to match the film thickness of 100 nm. These devices were kept in a glove box overnight until all solvent evaporated, spin-coated with an interfacial PFN layer (0.5 mg/mL in methanol, 5000 rpm, 30s), as described in Huang, F. Novel electroluminescent conjugated polyelectrolytes based on polyfluorene, Chem. Mater. 16, 708-716 (2004), then transferred (without exposure to air) to a vacuum evaporator (Angstrom Engineering Inc.) equipped with a variety of masks and a gradient shutter. Subsequently, an Al electrode was deposited without breaking vacuum at pressures below 1×10$^{-6}$ mbar and at a rate of 1 Å s$^{-1}$. The area defined by the shadow mask gave device areas of 2 mm×5 mm. A device schematic is shown below.

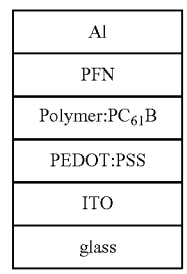

Schematic diagram of PDTBDTFBT:PC$_{61}$BM OPVs.

The completed devices were then encapsulated with glass and a UV-cured epoxy (Summers Optical, Lens Bond type J-91) by exposing to 365 nm UV light inside a N$_2$ glovebox (10 min). The encapsulated devices were then removed from the glovebox and tested within 1 h.

Current-Voltage (J-V) Characteristics: OPV cells were tested with an Oriel solar simulator fitted with a 1000 W Xe lamp filtered to give an output of 100 mW cm$^{-2}$ at AM 1.5G, The lamp was calibrated using a standard, filtered Si cell from Peccell Limited which was subsequently cross-calibrated with a standard reference cell traceable to the National Renewable Energy Laboratory. The devices were tested using a Keithley 2400 Sourcemeter controlled by Labview software. The J-V characteristics of the solar cells were measured and device performance extracted from the J-V data.

IPCE Measurements: IPCE ratio data was collected using an Oriel 150 W Xe lamp coupled to a monochromator and an optical fibre. The output of the optical fiber was focussed to give a beam that was contained within the area of the device. IPCE data was calibrated with a standard, unfiltered Si cell.

Space-Charge-Limited Current (SCLC) Mobility Measurement: The exact same device configuration as in working devices was used in the single carrier devices except that in the hole-only devices, Al was replaced by high work function MoO$_3$/Au as the cathode; and in electron-only devices, a titanium(IV) oxide bis(2,4-pentanedionate) (TOPD) layer [Wang, F. Z. et al. Org. Electron. 13, 2429-2435 (2012)] was inserted between PEDOT:PSS and the active layer.

X-Ray Diffraction Measurements

2D-WAXS: 2DWAXS measurements were performed using a rotating anode (Rigaku 18 kW), Osmic confocal MaxFlux optics, X-ray beam with pinhole collimation and a MAR345 image plate detector. The samples were prepared as a thin filament of 0.7 mm in diameter via filament extrusion at 80° C. For the measurements, the samples were positioned perpendicular to the incident X-ray beam and vertical to the 2D detector.

GIWAXS: GIWAXS measurements were performed using a custom setup consisting of a Siemens Kristalloflex X-ray source (copper anode X-ray tube operated at 30 kV and 20 mA), Osmic confocal MaxFlux optics and a three pinhole collimation system (JJ X-ray). The samples were prepared according to the conditions for device fabrication (see above for details OPV device preparation) on top of 1×1 cm silicon substrates and were irradiated at the incident angle (α$_i$) of 0.20°.

Examples 2 to 11

Conjugated polymers of Examples 2 to 11 shown in Table 2 are prepared by reaction of the A-D-A macromonomer with monomer D2 (each provided with terminal coupling partners [in accordance with formula (XIa) and (XII)] as shown in Table 2 using the general approach shown in Scheme 1 above for preparation of compound 5c.

Methods which are used may include Stille-coupling polymerisation and Suzuki-coupling polymerisation as described in the following general methods.

General Method of Stille-Coupling for A-D1-A Macromonomer:

Compound D1 (2 mmol, 1 eq.) and A (5 mmol, 2.5 eq.) were dissolved in toluene (100 mL) in a two-neck flask under the protection of argon. After adding $Pd(PPh_3)_4$ (0.1 mmol, 5% eq.) as the catalyst, the reaction mixture was stirred and heated to 80° C. for 16 h. The solution was poured into water (50 mL) with vigorous stirring and the aqueous layer was extracted with dichloromethane. The combined organic layers were dried with $MgSO_4$ and then rotary evaporated to remove the solvent. The dark red crude product was purified by column chromatography on silica gel with dichloromethane/n-heptane as eluent, affording crystals as pure product (80-90% yield).

General Method of Stille-Coupling Polymerization for Symmetric Polymers

In a glove box, the monomer D1 (or D2) (0.5 mmol) and monomer A-D1-A (0.5 mmol) were mixed in a microwave reaction tube. After being dissolved in 5 mL of o-xylene, $Pd_2(dba)_3$ (20 µmol) and tri(o-tolyl)phosphine (80 µmol) was added as the catalyst, and the tube was sealed with a Teflon® cap. The reaction mixture was heated to 100° C. for 1 minute, 135° C. for 1 minute, 170° C. for 1 hour, and 200° C. for 20 minutes using a Biotage microwave reactor. The resulting polymer was end-capped by reacting with 0.2 mL 2-(tributylstannyl)thiophene and 0.2 mL 2-bromothiophene at 170° C. for 20 minutes, respectively. The end-capped polymer was precipitated by addition of 50 mL methanol and filtered through a Soxhlet thimble. The precipitate was then subjected to Soxhlet extraction with acetone, ethyl acetate, n-heptane, dichloromethane and chloroform. The polymer was recovered as a solid from the chloroform fraction by precipitation from methanol. The solid was dried under vacuum. The yield and HT-GPC results of the polymers are given below.

General Method of Suzuki-Coupling Polymerization for Symmetric Polymers

In a glove box, the monomer D1 (or D2) (0.5 mmol) and monomer A-D1-A (0.5 mmol) were mixed in a microwave reaction tube. After being dissolved in 5 mL of o-xylene, the solution was blend with 5 mL 2M $K_2CO_3$ aqueous solution and 2 drops of Aliquat 336. Under agron atmosphere, $Pd(PPh_3)_4$ (20 µmol) was added as the catalyst, and the tube was sealed with a Teflon® cap. The reaction condition and purification processes were similar to those used for the Stille-coupling polymers.

A-D1-A and D2 Examples

TABLE

| No | A-D1-A | D2 |
|---|---|---|
| 2 | [structure] | [structure] |

| | | |
|---|---|---|
| 3 | 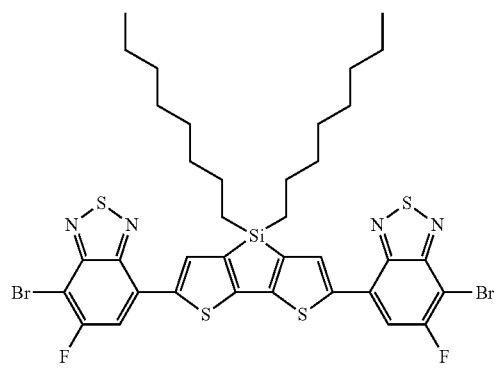 | 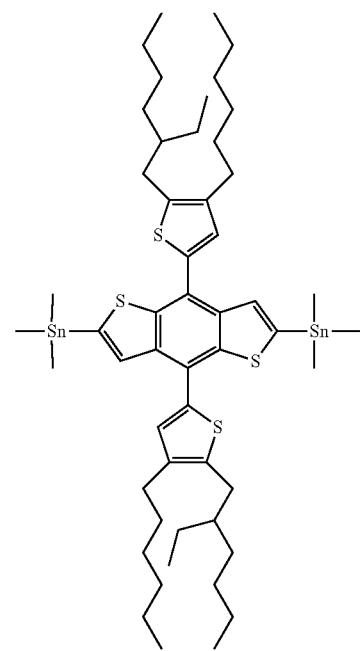 |
| 4 | 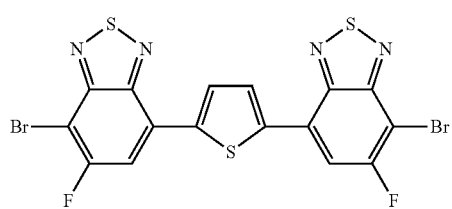 | 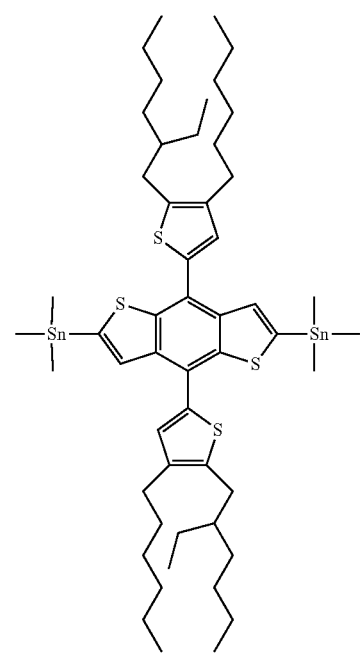 |

TABLE-continued
| 5 | 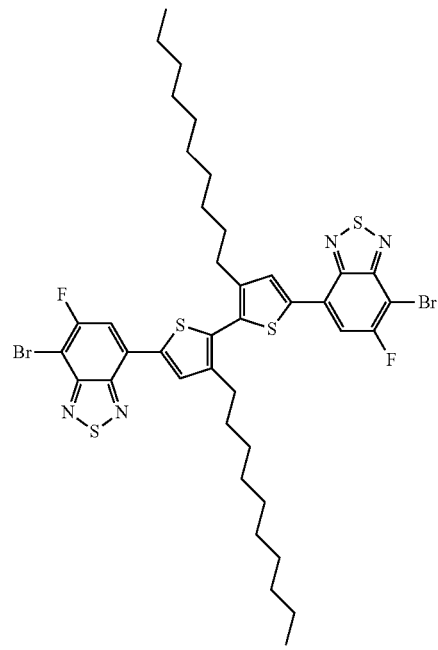 | 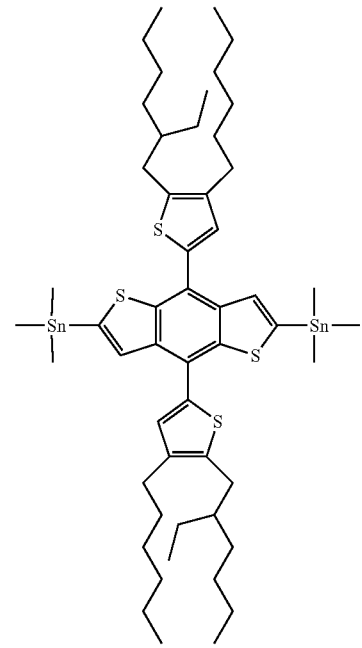 |
| 6 | 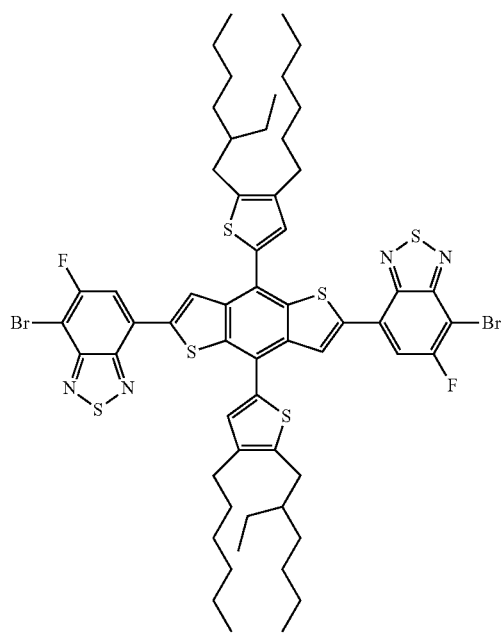 | 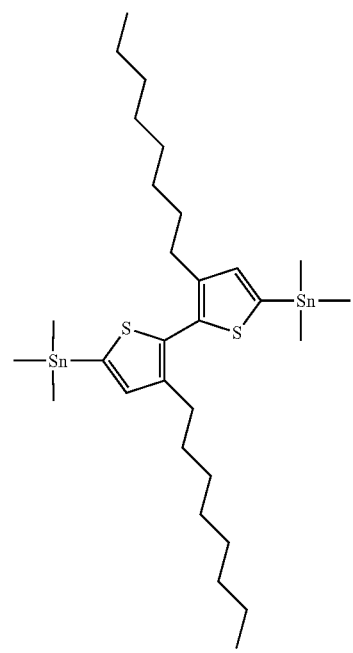 |

TABLE-continued
| 7 | 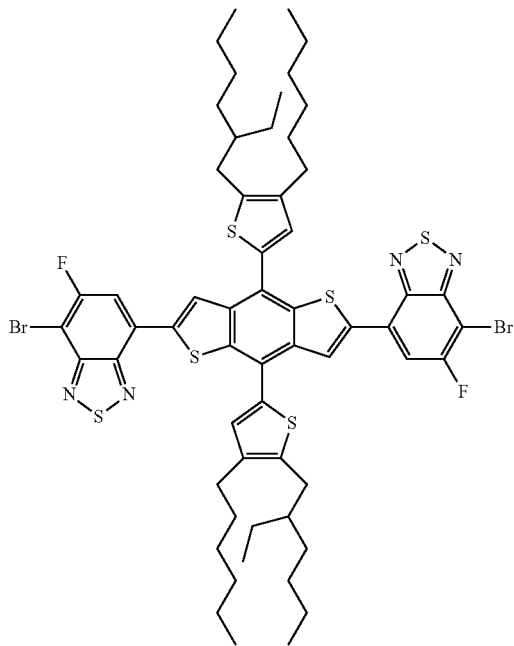 | |
| --- | --- | --- |
| 8 | 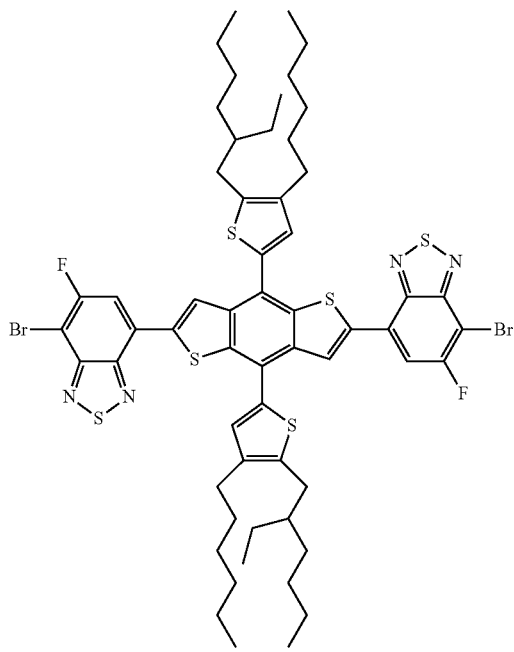 [SMILES: CCCCCCc1cc(-c2c3cc(-c4cc(F)c(Br)c5nsnc45)sc3c(-c3cc(CCCCCC)c(CC(CC)CCCC)s3)c3cc(-c4cc(F)c(Br)c5nsnc45)sc23)sc1CC(CC)CCCC] | 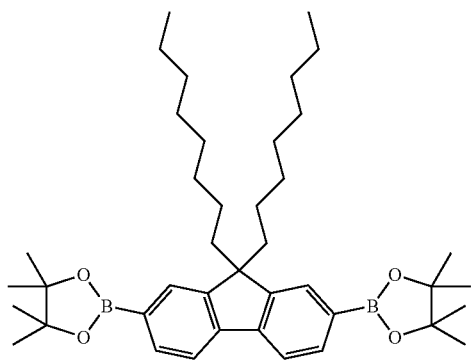 |

TABLE-continued
| | | |
|---|---|---|
| 9 | 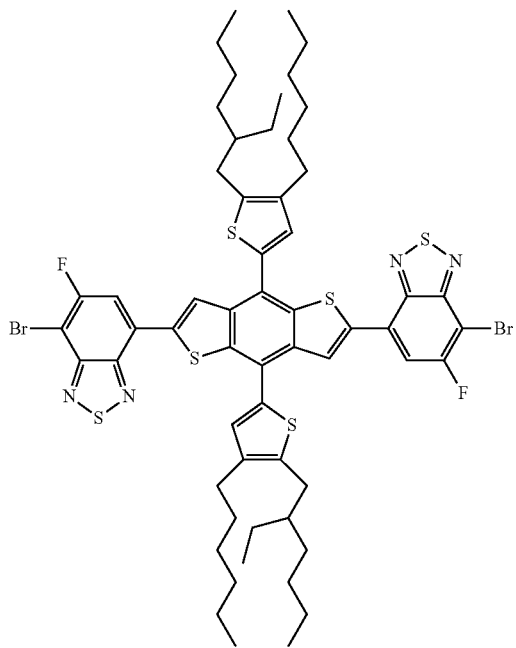 [SMILES: CCCCCCc1cc(-c2c3cc(-c4cc(F)c(Br)c5nsnc45)sc3c(-c3cc(CCCCCC)c(CC(CC)CCCC)s3)c3cc(-c4cc(F)c(Br)c5nsnc45)sc23)sc1CC(CC)CCCC] | |
| 10 | 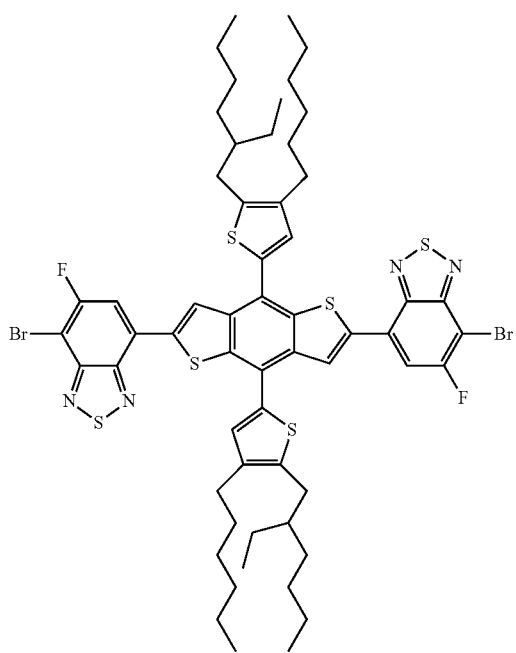 [SMILES: CCCCCCc1cc(-c2c3cc(-c4cc(F)c(Br)c5nsnc45)sc3c(-c3cc(CCCCCC)c(CC(CC)CCCC)s3)c3cc(-c4cc(F)c(Br)c5nsnc45)sc23)sc1CC(CC)CCCC] | 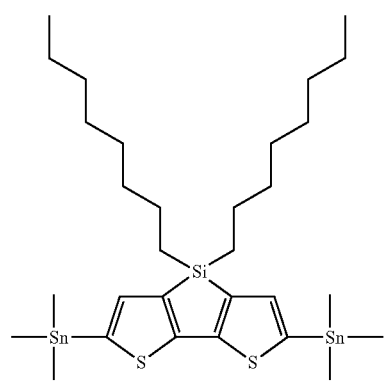 |

| 11 | 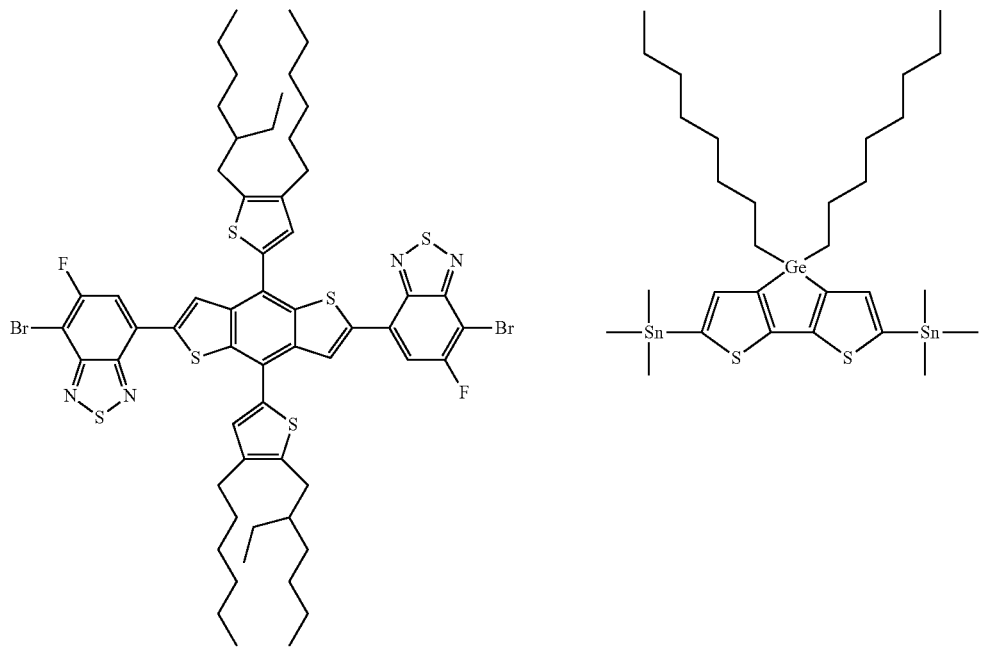 | |
| No | A-D1-A-D2 |
|---|---|
| 2 | 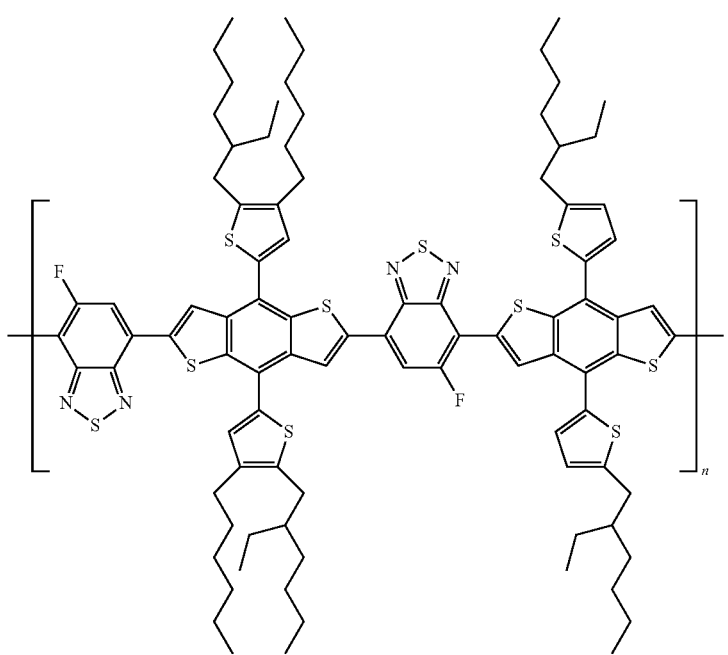 |

TABLE-continued
3
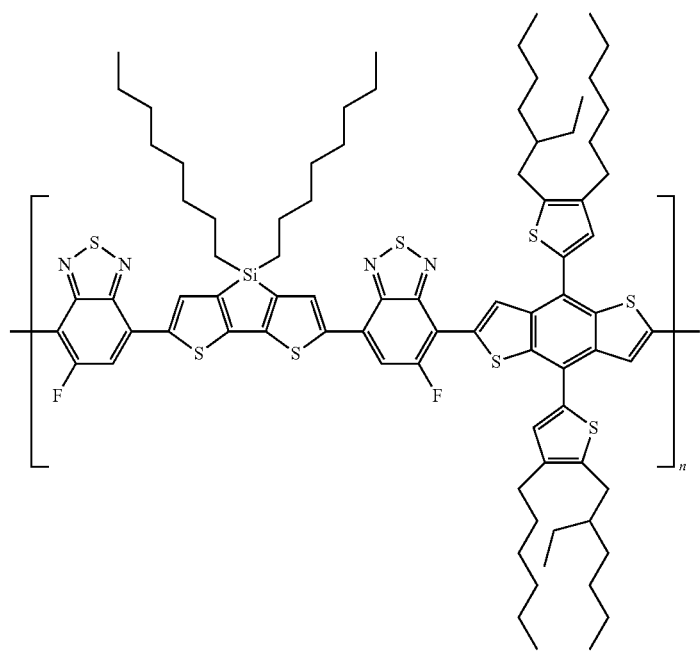
4
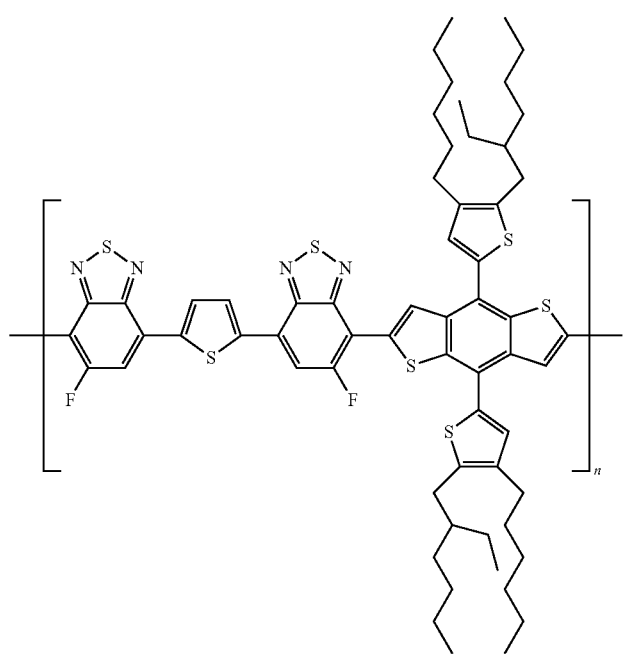

TABLE-continued
5
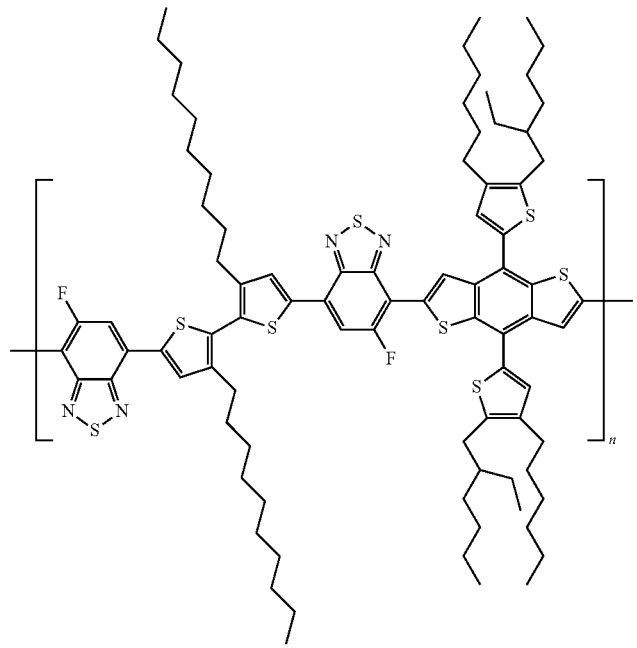
6
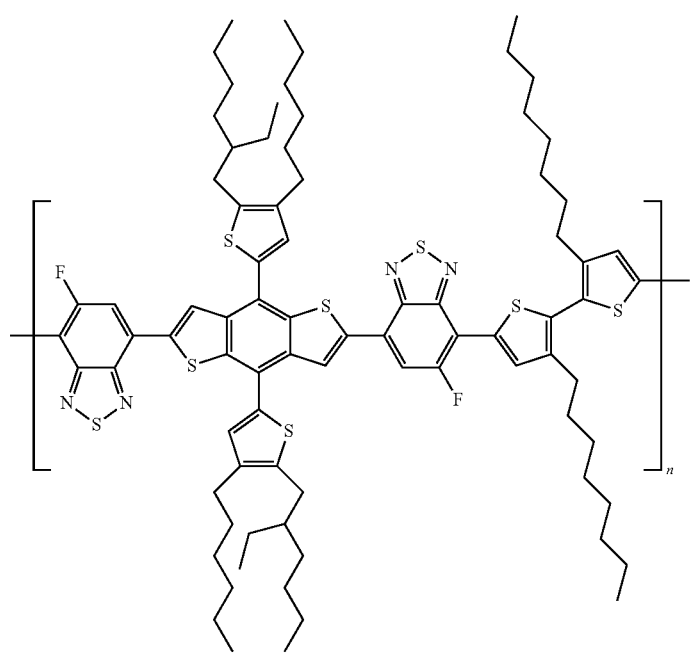

TABLE-continued
7 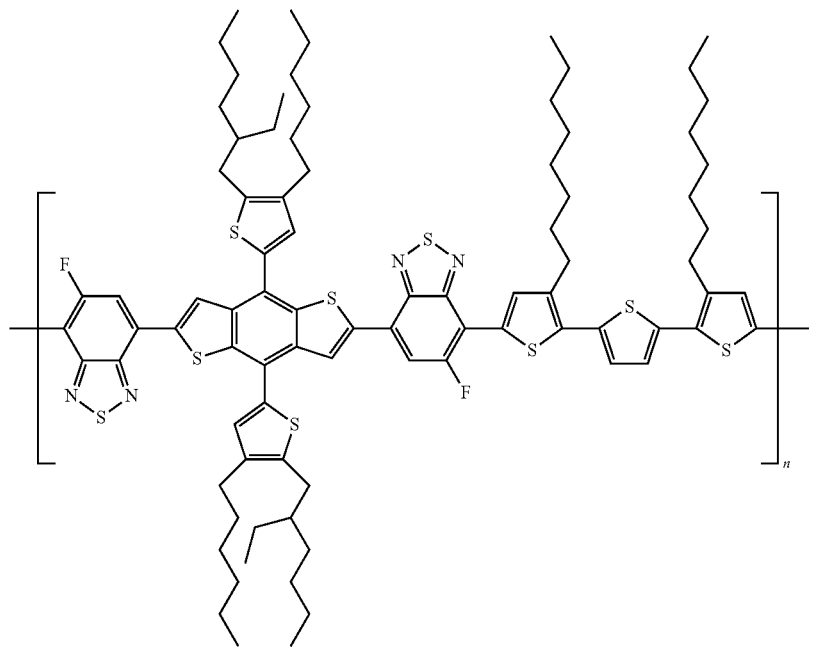
8 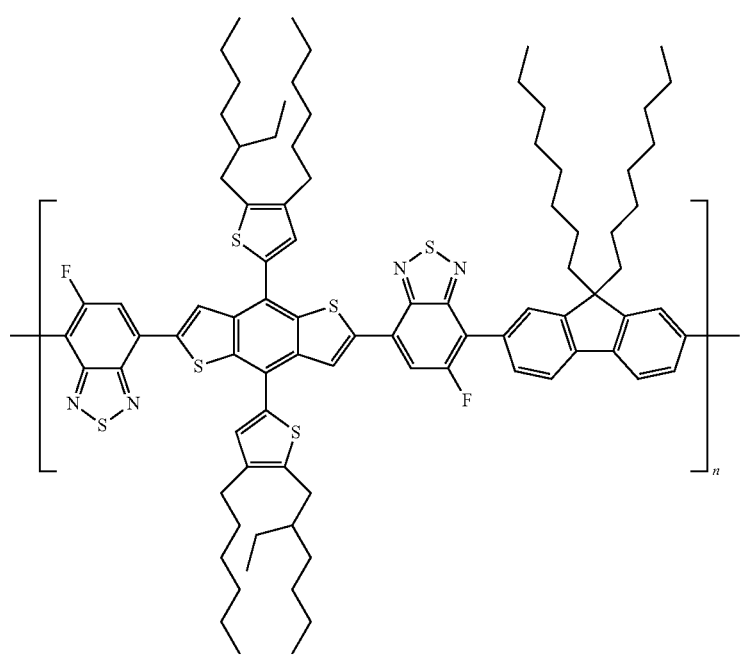

TABLE-continued
9
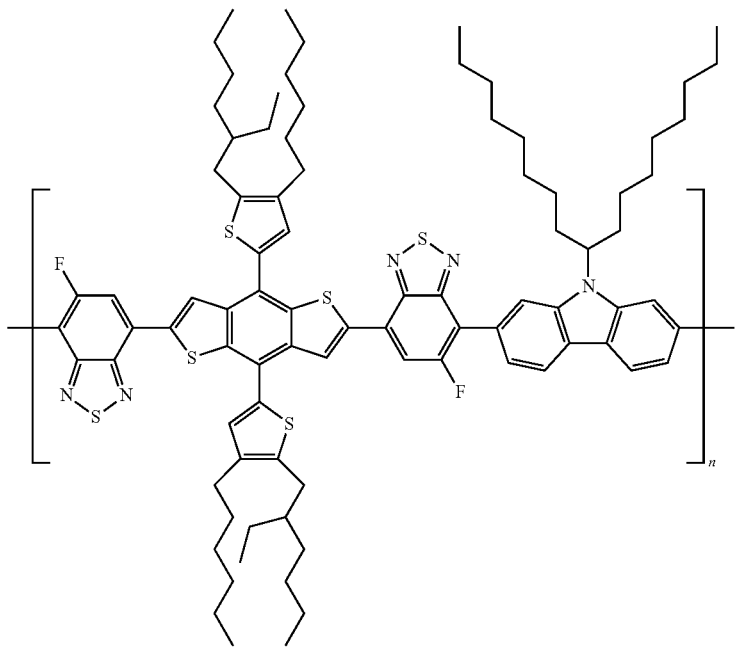
10
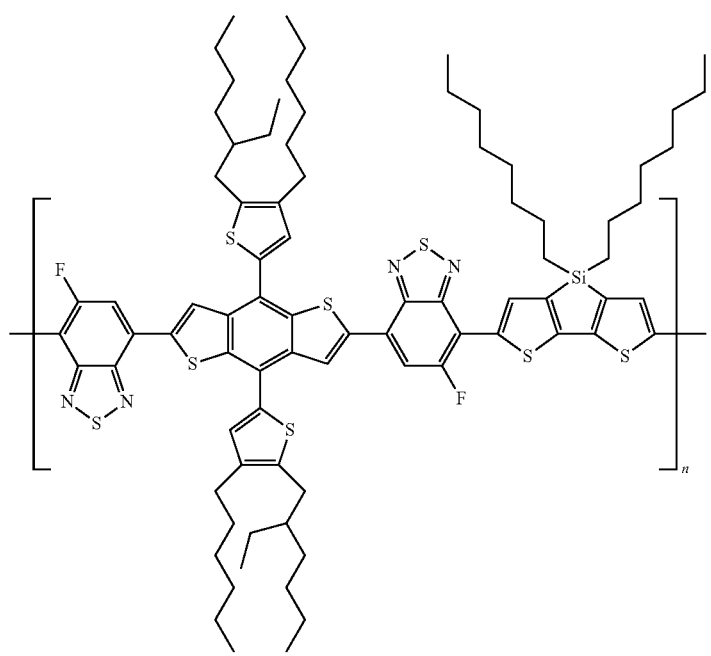

TABLE-continued

11

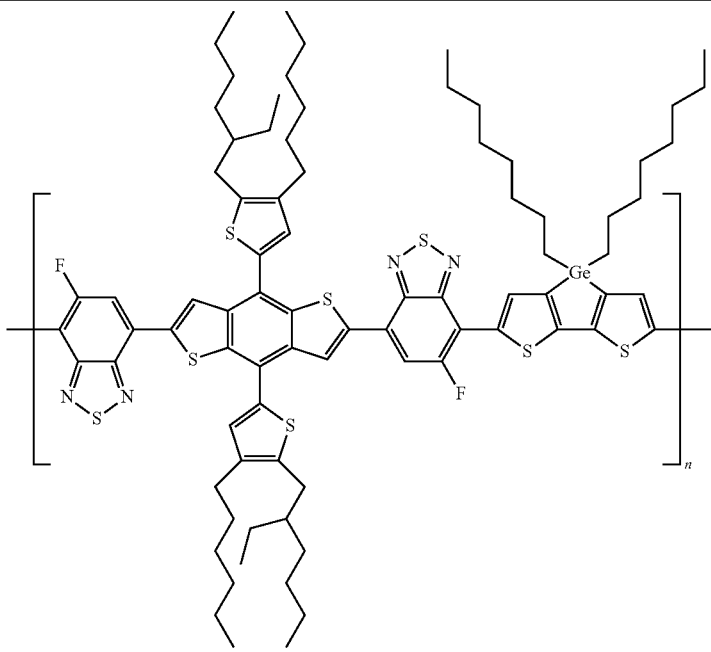

The invention claimed is:

1. A regioregular conjugated polymer for optoelectronic devices, comprising a structural unit of formula (I) or formula (II):

-[A-D1-A-D2]$_n$-  (I)

-[A1-D1-A2-D2]$_n$-  (II)

wherein
A is an acceptor group;
A1 and A2 are acceptor groups which differ from one another;
D1 and D2 are donor groups which differ from one another; and
n is an integer between 30 and 1000,
wherein the acceptor is an asymmetric group and the acceptor groups A are disposed with mutual symmetry about the donor group D1.

2. The polymer according to claim 1, wherein the structural unit is of formula (I) and the acceptor group, A, is selected from the group consisting of:

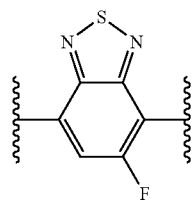

4

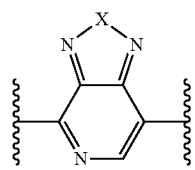

6a

-continued

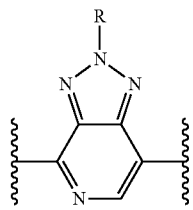

11a

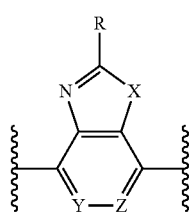

12

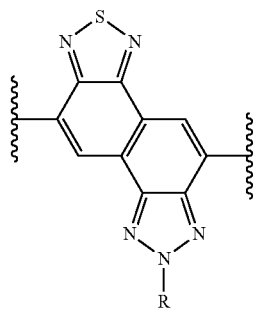

16

-continued

18

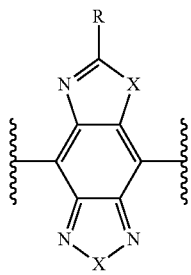

19

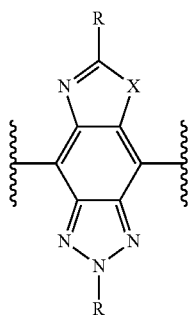

and

20

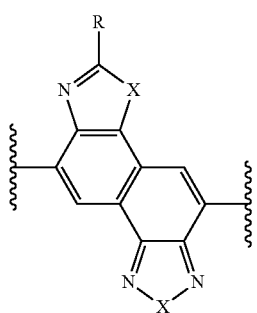

21

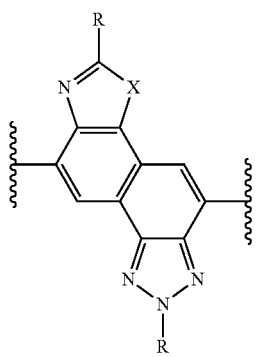

wherein
R is alkyl or aryl;
X is S or O;
Y and Z are independently selected from the group consisting of C—H, C—R, C—F, C—Cl, C—CF$_3$, C—CN, N, C—COOH, C—COOR and C—CONHR.

3. The polymer according to claim 1, wherein the acceptor group A at each occurrence is of formula (4):

(4)

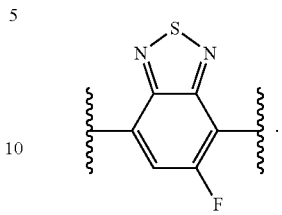

4. The polymer according to claim 1, wherein D1 and D2 are independently selected from the group consisting of:

(IIIa)

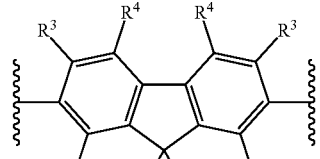

(IVa)

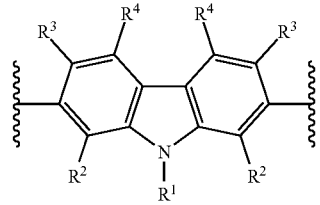

(IXa)

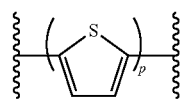

(Va)

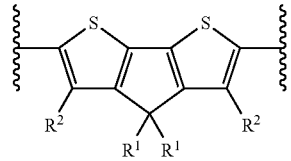

(VIa)

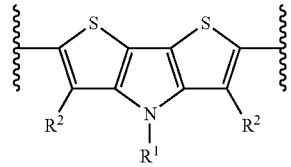

(VIIa)

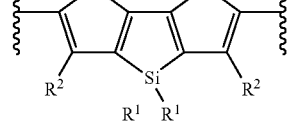

(IXb)

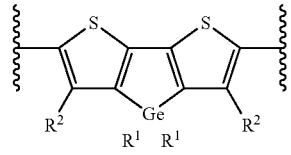

(IXc)

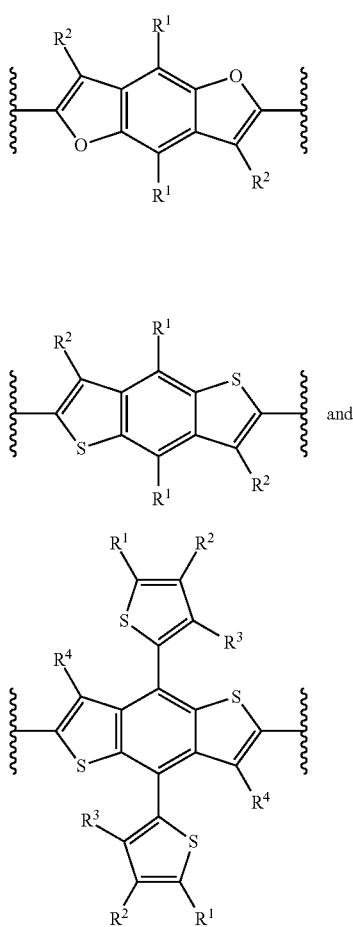

(VIIIa)

and (Xa)

wherein
R¹ to R⁴ are independently selected from the group consisting of hydrogen, optionally substituted alkyl, optionally substituted alkenyl, optionally substituted alkynyl, optionally substituted carbocyclyl, optionally substituted aryl, and optionally substituted heterocyclyl; and
p is an integer from 1 to 3.

5. The polymer according to claim 4, wherein D1 and D2 are different monomer units independently selected from structural units of formula (Xa)

(Xa)

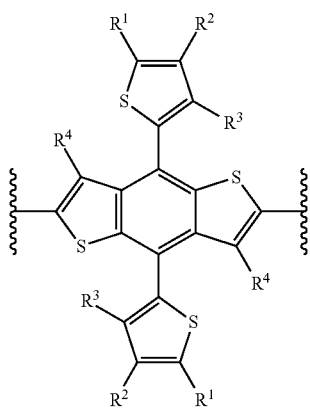

wherein
R¹ to R⁴ are independently selected from hydrogen, optionally substituted alkyl, optionally substituted alkenyl, optionally substituted alkynyl, optionally substituted carbocyclyl, optionally substituted aryl, and optionally substituted heterocyclyl.

6. The polymer according to claim 5, wherein R³ or R⁴ are hydrogen.

7. The polymer according to claim 6, wherein the substituents R¹ or R² are independently selected from hydrogen or an optionally substituted alkyl chain and at least one of R¹ or R² is optionally substituted alkyl.

8. The polymer according to claim 1, wherein the polymer has a number average molar mass in the range of 40,000 to 100,000 Daltons.

9. The polymer according to claim 1, wherein the polymer comprises thiophene or phenyl endcaps.

10. The polymer according to claim 1, which is a polymer of a macromonomer comprising a structural unit of formula (XI) and a donor monomer, D2:

A-D1-A    (XI).

11. The polymer according to claim 1, which is a polymer of a macromonomer comprising formula (XIa) with a donor monomer of formula (XIII):

P-A-D1-A-P    (XIa)

Q-D2-Q    (XIII)

wherein P and Q are reactive coupling partners; and
wherein the acceptor groups, A, are disposed with mutual symmetry about donor group D1.

12. The polymer according to claim 11, wherein the macromonomer is of formula (XIb):

(XIb)

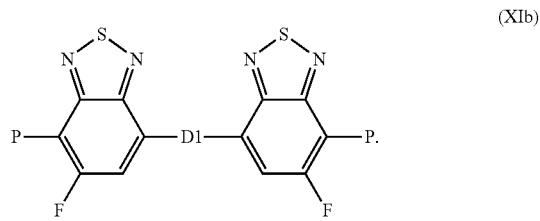

13. The polymer according to claim 11,
wherein either
(a) P is selected from the group consisting of bromine, iodine and pseudo-halides; and
Q is selected from the group consisting of alkenyl, —B(R⁵)₂, —BF₃K, —SiR⁶₃, —SnR₃, —MgX, —ZnCl, —ZnBr, —ZnI;
wherein
R is alkyl or aryl;
R⁵ is selected from the group consisting of R and (OR); and
R⁶ is chlorine, fluorine or alkyl; and
X is selected from the group consisting of bromine, iodine and pseudo-halides; or
(b) P is selected from the group consisting of alkenyl, —B(R⁵)₂, —BF₃K, —SiR⁶₃, —SnR₃, —MgX, —ZnCl, —ZnBr, —ZnI;
Q is selected from the group consisting of bromine, iodine and pseudo-halides;
R is alkyl;
R⁵ is selected from the group consisting of R and (OR);
R⁶ is chlorine, fluorine or alkyl; and X is selected from the group consisting of bromine, iodine and pseudo-halides.

14. A method of preparing a polymer according to claim 1, comprising polymerising a macromonomer of formula (XIa) with a donor monomer of formula (XIII)

P-A-D1-A-P      (XIa)

Q-D$_2$-Q        (XIII)

wherein P and Q are reactive coupling partners; and wherein acceptor groups, A, are disposed with mutual symmetry about donor group D1.

15. The method according to claim 14, wherein the macromonomer of formula (XI) or (XIa) is prepared by reaction of D1 with an acceptor of any one of formulae shown in claim 2 to provide selective coupling of the acceptor, one unit of acceptor on each side of the donor wherein said acceptor is coupled with mutual symmetry about donor D1.

16. A photosensitive optoelectronic device comprising one or more polymers according to claim 1.

17. The device according to claim 16, wherein the device is a photovoltaic device, a photoconductive device or a photodetector.

18. A solar cell device fabricated using one or more polymers according to claim 1 and an electron acceptor polymer or molecule.

19. The solar cell device according to claim 18, wherein the electron acceptor polymer or molecule is one or more fullerene derivatives.

* * * * *